US007560949B2

(12) United States Patent
Noda

(10) Patent No.: US 7,560,949 B2
(45) Date of Patent: Jul. 14, 2009

(54) MANUFACTURING METHOD OF SEMICONDUCTOR DEVICE AND SEMICONDUCTOR DEVICE CORRESPONDING TO LOOP BACK TEST

(75) Inventor: Hiroshi Noda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 252 days.

(21) Appl. No.: 11/730,038

(22) Filed: Mar. 29, 2007

(65) Prior Publication Data

US 2007/0245179 A1 Oct. 18, 2007

(30) Foreign Application Priority Data

Mar. 31, 2006 (JP) .............................. 2006-098532

(51) Int. Cl.
*G01R 31/26* (2006.01)

(52) U.S. Cl. ...................................... 324/765

(58) Field of Classification Search ....................... None
See application file for complete search history.

(56) References Cited

U.S. PATENT DOCUMENTS

| 4,894,605 | A | * | 1/1990 | Ringleb et al. ............... 324/754 |
| 4,989,068 | A | * | 1/1991 | Yasuhara et al. ............ 257/788 |
| 5,276,346 | A | * | 1/1994 | Iwai et al. .................... 257/360 |
| 5,502,392 | A | * | 3/1996 | Arjavalingam et al. ...... 324/638 |
| 5,962,868 | A | * | 10/1999 | Tanida ......................... 324/757 |
| 6,030,890 | A | * | 2/2000 | Iwabuchi ..................... 438/613 |
| 7,256,600 | B2 | * | 8/2007 | Walker et al. ................ 324/763 |
| 2001/0026949 | A1 | * | 10/2001 | Ogawa et al. ................ 324/765 |

FOREIGN PATENT DOCUMENTS

| JP | 11-160388 | 6/1999 |
| JP | 2000-171524 | 6/2000 |
| JP | 2003-167034 | 6/2003 |
| JP | 2003-255022 | 9/2003 |
| JP | 2005-136246 | 5/2005 |

* cited by examiner

*Primary Examiner*—Jermele M Hollington
(74) *Attorney, Agent, or Firm*—McDermott Will & Emery LLP

(57) ABSTRACT

The testing device is provided with the first element having one end coupled to an input terminal, and the other end coupled to an output terminal, and attenuating a direct-current component, and the second element having one end coupled to the input terminal, and attenuating an alternating current component. The manufacturing method of a semiconductor device includes the step which connects an external output terminal of the semiconductor device, and the input terminal of the testing device, and connects an external input terminal of the semiconductor device, and the output terminal of the testing device, the step which tests the voltage of the other end of the second element, and the step which outputs an alternating current signal to the testing device from the external output terminal of the semiconductor device, and tests the signal which the semiconductor device received in the external input terminal from the testing device.

9 Claims, 25 Drawing Sheets

MANUFACTURING METHOD OF SEMICONDUCTOR DEVICE AND SEMICONDUCTOR DEVICE CORRESPONDING TO LOOP BACK TEST

This nonprovisional application is based on Japanese Patent Application No. 2006-098532 filed with the Japan Patent Office on Mar. 31, 2006, the entire contents of which are hereby incorporated by reference.

BACKGROUND OF THE INVENTION

1. Field of the Invention

The present invention relates to a manufacturing method of a semiconductor device and the semiconductor device, and especially relates to a manufacturing method of a semiconductor device and the semiconductor device with which a loop back test is performed.

2. Description of the Background Art

By advanced features and speeding up of digital information apparatus, network equipment, etc., an implementation of a high-speed interface (a data transfer rate being 1 Gbps or more) is progressing with the semiconductor for communication. In order to carry out the mass production test of the semiconductor device carrying a high-speed interface as usual at a real operation speed, i.e., speed used as a product, the expensive highly efficient circuit tester for examining a semiconductor device is needed, and it leads to the jump of test cost. However, the unit price of the product with which a semiconductor device is incorporated tends to fall, and reduction of test cost is demanded.

Then, the loop back test technique attracts attention as the technique of carrying out the AC (alternating current) characteristics test (it also being hereafter called an AC test.) of a high-speed interface, without using a highly efficient circuit tester. The loop back test technique is the technique of turning and inputting the signal outputted from the driver with which a semiconductor device is provided into the receiver with which a semiconductor device is provided, and judging the function of a semiconductor device at real operation speed.

As an equipment which tests a semiconductor device, the following semiconductor test equipment is disclosed by Japanese Patent Laying-Open No. 2003-255022 (Patent Reference 1), for example. That is, a changeover switch is formed and it has structure which can choose the input signal from the other devices connected in real operation, or the input signal from measuring apparatus for the input signal to a device under test. Then, it measures by connecting with measuring apparatus at measurement of a DC low-speed signal level. At measurement of the high speed signal which cannot deal with in the input signal from measuring apparatus, it connects with other devices, high-speed operation of the device under test is performed, and only the output signal is measured with measuring apparatus.

The following semiconductor test equipment is disclosed by Japanese Patent Laying-Open No. 11-160388 (Patent Reference 2). That is, it is provided with a plurality of power supply circuits which supply a power supply individually for every power supply terminal of a plurality of devices under test, the capacitor for low frequency connected in parallel with each power supply circuit, the relay by which it was formed for this every capacitor and the point of contact was connected to this capacitor at series, respectively, and the power supply circuit for loads for the load circuit on a test board. The exiting coil of a relay is driven with the voltage of the power supply circuit for loads. The semiconductor test equipment which does a loop back test is disclosed by Japanese Patent Laying-Open No. 2000-171524 (Patent Reference 3) and Japanese Patent Laying-Open No. 2003-167034 (Patent Reference 4).

However, the semiconductor test equipment described in Patent Reference 1 and Patent Reference 2 is not provided with the structure which does a loop back test. When it connects simply the driver and receiver which are the interface circuitries of the semiconductor device which is a test objective like semiconductor test equipment described in Patent Reference 3 and Patent Reference 4, in order to do a loop back test, the DC (direct current) characteristic test (it is also hereafter called a DC test.), for example measuring the potential in an output of the driver and the potential in an input of the driver, respectively of a semiconductor device cannot be performed. That is, a receiver does not have the function to judge the DC characteristic of a driver (transmitter), and a driver does not have the function to judge a receiver's DC characteristic either. Therefore, where a driver and a receiver are short-circuited, the DC characteristic of a driver and a receiver cannot be judged, respectively. Therefore, when the wiring for loop back tests was formed on a test board and a loop back test was performed at the test (it is also hereafter called final test FT.) step performed in the state where dicing etc. was performed to the semiconductor chip on a silicon wafer, and it was package-ized, a DC test was not able to be performed in the final test process. Therefore, it is necessary to do a DC test at a test process other than a final test process, concretely in the test (it is also hereafter called wafer test WT.) step performed in the state where the semiconductor chip is mounted on the silicon wafer, and to do a loop back test in a final test process.

Here, in a DC test, a probe is applied to the bonding pad, i.e., the electrode, of a semiconductor device of a wafer state, and supply, measurement, etc. of voltage are performed. However, when a probe is applied to a bonding pad, a bonding pad will get damaged, and adhesion of a bonding wire will be difficult. So, in order to fully secure the region to which a probe is applied, and the region which pastes up a bonding wire, it is necessary to enlarge area of a bonding pad. When it does so, the parasitic capacitance to a bonding pad will become large, and the AC characteristics of a semiconductor device will deteriorate. For this reason, especially about the bonding pad for a high-speed interface, it becomes difficult to enlarge area of a bonding pad and to fully secure the region to which a probe is applied, and the region which pastes up a bonding wire. It will become impossible to do the DC test of a high-speed interface circuitry to the semiconductor device of a wafer state.

SUMMARY OF THE INVENTION

A purpose of the present invention is to offer a manufacturing method of a semiconductor device and the semiconductor device which can prevent degradation of AC characteristics while performing a DC characteristic test, and the AC-characteristics test by a loop back test.

The manufacturing method of a semiconductor device concerning an aspect with this invention is a manufacturing method of a semiconductor device having a semiconductor integrated circuit using a testing device, wherein the testing device comprises: an input terminal; an output terminal; a first element having one end coupled to the input terminal of the testing device and the other end coupled to the output terminal of the testing device, and attenuating a direct-current component; and a second element having one end coupled to the input terminal or the output terminal of the testing device, and attenuating an alternating current component; and wherein the manufacturing method of the semiconductor device comprises the steps of: forming the semiconductor integrated circuit including a pad for output signals, and a pad for input signals; preparing an external output terminal and an external input terminal; performing bonding of the pad for output signals, and the external output terminal, and performing bonding of the pad for input signals, and the external input terminal; electrically connecting the external output terminal and the input terminal of the testing device, and electrically connecting the external input terminal and the output terminal of the testing device; performing a direct current test which judges good or bad of the semiconductor device based on a voltage of the other end of the second element; and performing an alternating current test which outputs an alternating current signal to the input terminal of the testing device via the external output terminal from the pad for output signals of the semiconductor integrated circuit, and which judges good or bad of the semiconductor device based on a signal which the semiconductor integrated circuit received in the pad for input signals from the output terminal of the testing device via the external input terminal.

The manufacturing method of a semiconductor device concerning another aspect of this invention is a manufacturing method of a semiconductor device having a semiconductor integrated circuit, comprising the steps of: forming the semiconductor integrated circuit having a driver circuit which transmits a signal to an outside; a receiver circuit which receives a signal from an outside; a pad for output signals coupled to the driver circuit; a pad for input signals coupled to the receiver circuit; a pad for measurement; a first switching element having one end coupled at a junction point of the driver circuit and the pad for output signals, and the other end having coupled to the pad for measurement; and a second switching element having one end coupled at a junction point of the receiver circuit and the pad for input signals, and the other end coupled to the pad for measurement; performing a direct current test which judges good or bad of the semiconductor device based on a voltage in the pad for measurement by making the first switching element into ON state, and making the second switching element into OFF state, or by making the first switching element OFF state, and making the second switching element into ON state; and performing an alternating current test which outputs an alternating current signal to an external circuit via the pad for output signals from the driver circuit by making the first switching element and the second switching element into OFF state, receives the alternating current signal which passed through the external circuit in the receiver circuit via the pad for input signals, and judges good or bad of the semiconductor device based on the alternating current signal which the receiver circuit received.

The manufacturing method of a semiconductor device concerning another aspect of this invention is a manufacturing method of a semiconductor device having a semiconductor integrated circuit, comprising the steps of: forming the semiconductor integrated circuit having a driver circuit which transmits a signal to an outside; a receiver circuit which receives a signal from an outside; a pad for output signals coupled to the driver circuit; a pad for input signals coupled to the receiver circuit; a pad for measurement; a first switching element having one end coupled at a junction point of the driver circuit and the pad for output signals, and the other end coupled to the pad for measurement; a second switching element having one end coupled at a junction point of the receiver circuit and the pad for input signals, and the other end coupled to the pad for measurement; and a third switching element having one end coupled to the driver circuit, and the other end coupled to the receiver circuit; performing a direct current test which judges good or bad of the semiconductor device based on a voltage in the pad for measurement by making the first switching element into ON state, and making the second switching element and the third switching element into OFF state, or by making the first switching element and the third switching element into OFF state, and making the second switching element into ON state; and performing an alternating current test which outputs an alternating current signal to the receiver circuit via the third switching element from the driver circuit by making the first switching element and the second switching element into OFF state, and making the third switching element into ON state, and judges good or bad of the semiconductor device based on the alternating current signal which the receiver circuit received.

The semiconductor device concerning an aspect with this invention is a semiconductor device having a semiconductor integrated circuit, wherein the semiconductor integrated circuit comprises: a driver circuit which transmits a signal to an outside; a receiver circuit which receives a signal from an outside; a pad for output signals coupled to the driver circuit; a pad for input signals coupled to the receiver circuit; a pad for measurement; a first switching element having one end coupled at a junction point of the driver circuit and the pad for output signals, and the other end coupled to the pad for measurement; and a second switching element having one end coupled at a junction point of the receiver circuit and the pad for input signals, and the other end coupled to the pad for measurement.

According to the present invention, while performing a DC characteristic test, and the AC-characteristics test by a loop back test, degradation of AC characteristics can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereafter, embodiments of the invention are explained in detail based on drawings. The same reference is given to the same or corresponding portion in a drawing, and the explanation is not repeated.

Embodiment 1

Figure 1:
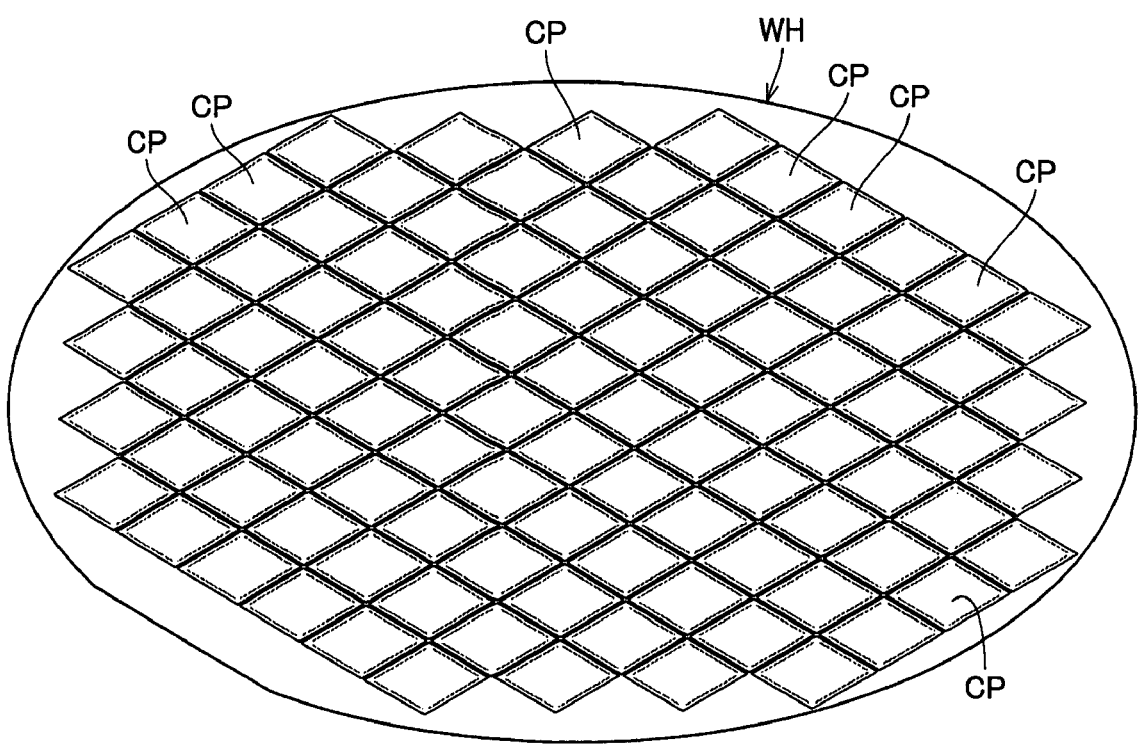
FIG. 1 is a plan view showing the structure of a semiconductor wafer.

FIG. 1 is a plan view showing the structure of a semiconductor wafer. With reference to FIG. 1, a plurality of semiconductor chip (semiconductor integrated circuit) CPs are formed on semiconductor wafer WH.

Semiconductor wafer WH is divided per semiconductor integrated circuit, and a semiconductor package is manufactured from divided semiconductor integrated circuit CP. Manufacture of a semiconductor device is completed by performing at least either one of wafer test WT to semiconductor integrated circuit CP, and final test FT to a semiconductor package.

Figure 2:
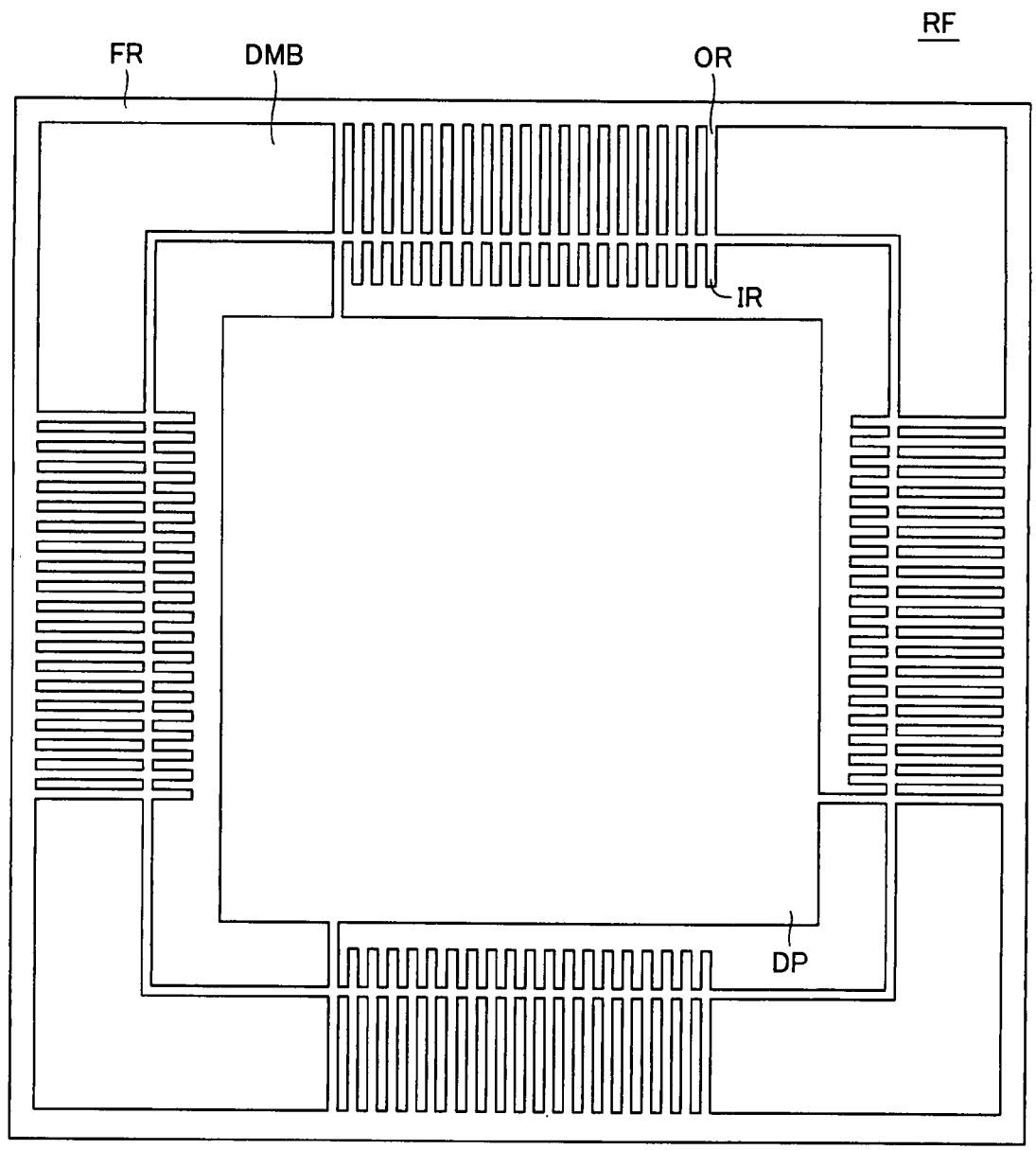
FIG. 2 is a plan view showing the structure of a lead frame.

FIG. 2 is a plan view showing the structure of a lead frame. With reference to FIG. 2, lead frame RF includes frame part FR, outer lead (external terminal) OR, dam bar DMB, inner lead IR, and die pad DP. Die pad DP functions also as an electrode for grounding potential.

[The Manufacturing Method of a Semiconductor Package]

Next, in an embodiment of the invention, how to manufacture a semiconductor package from a semiconductor chip (semiconductor integrated circuit) and other parts is explained.

Figure 3:
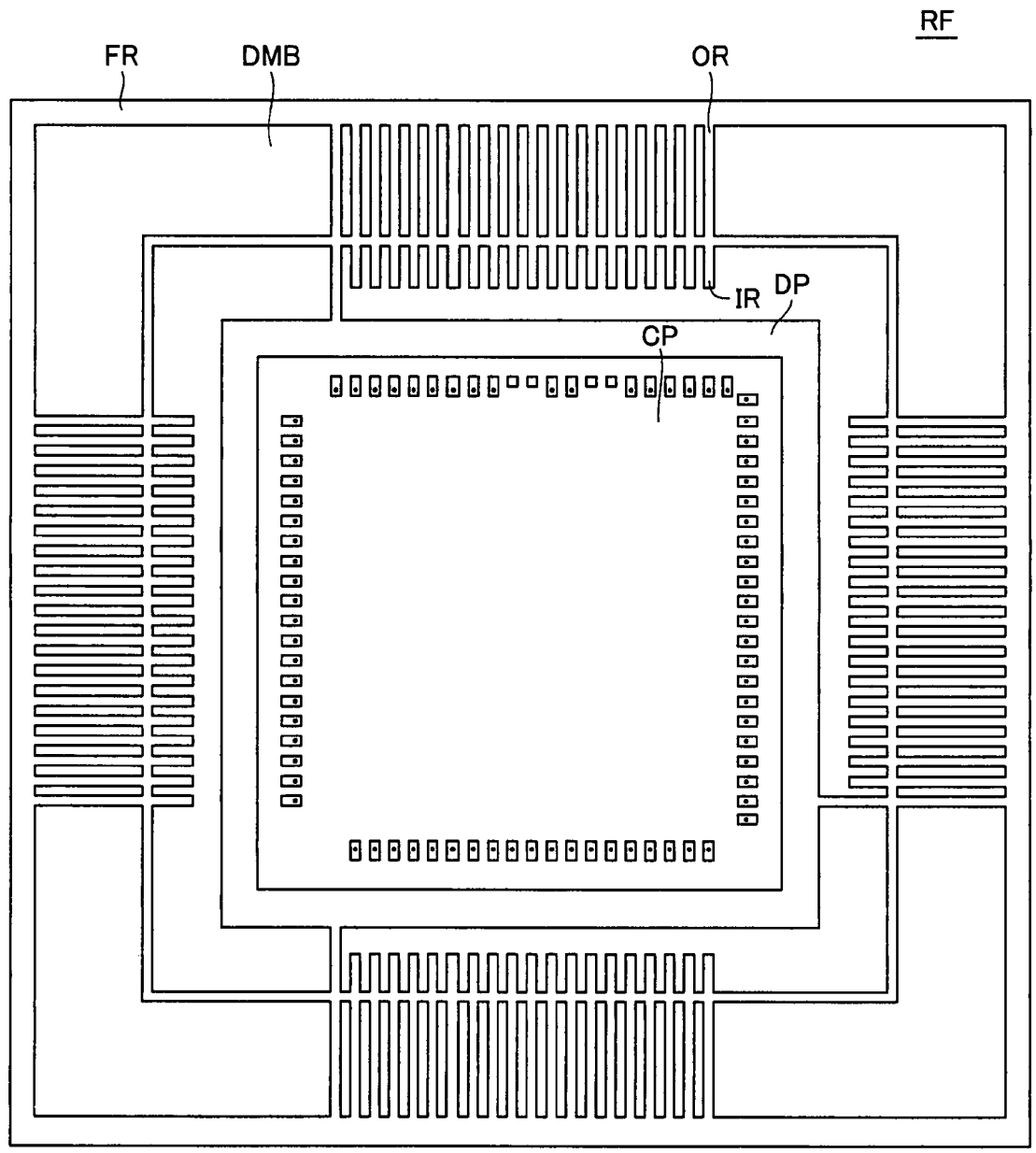
FIG. 3 is a plan view showing the state where the semiconductor chip is mounted in the lead frame.

FIG. 3 is a plan view showing the state where the semiconductor chip is mounted on the lead frame. With reference to FIG. 3, semiconductor chip CP is pasted up (die bonding) on die pad DP.

Figure 4:
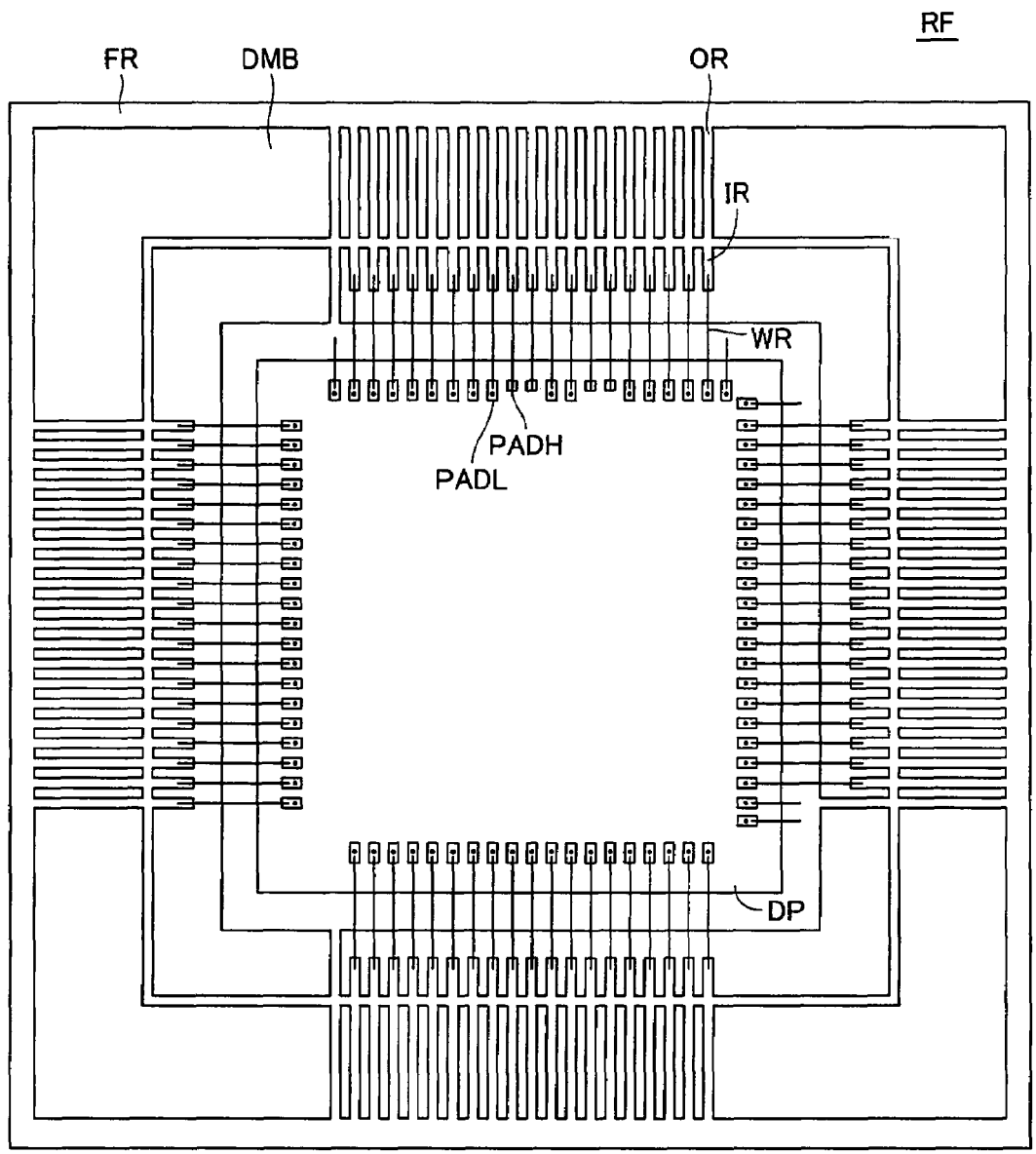
FIG. 4 is a plan view showing the state where wire bonding of the semiconductor chip is performed.
Figure 5:
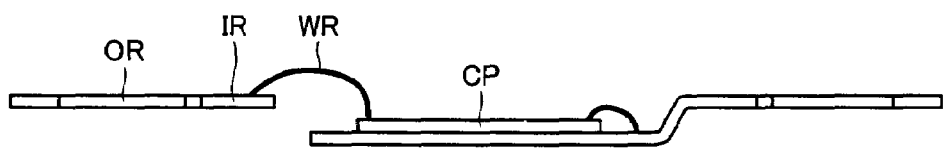
FIG. 5 is a side view showing the state where wire bonding of the semiconductor chip is performed.

FIG. 4 is a plan view showing the state where wire bonding of the semiconductor chip is performed. FIG. 5 is a side view showing the state where wire bonding of the semiconductor chip is performed.

With reference to FIG. 4 and FIG. 5, bonding wire WR is pasted to bonding pad PADL and PADH in semiconductor chip CP, and inner lead IR, namely, wire bonding is performed to them. As for inner lead IR and outer lead OR, bonding may be performed and they may be unified.

Figure 6:
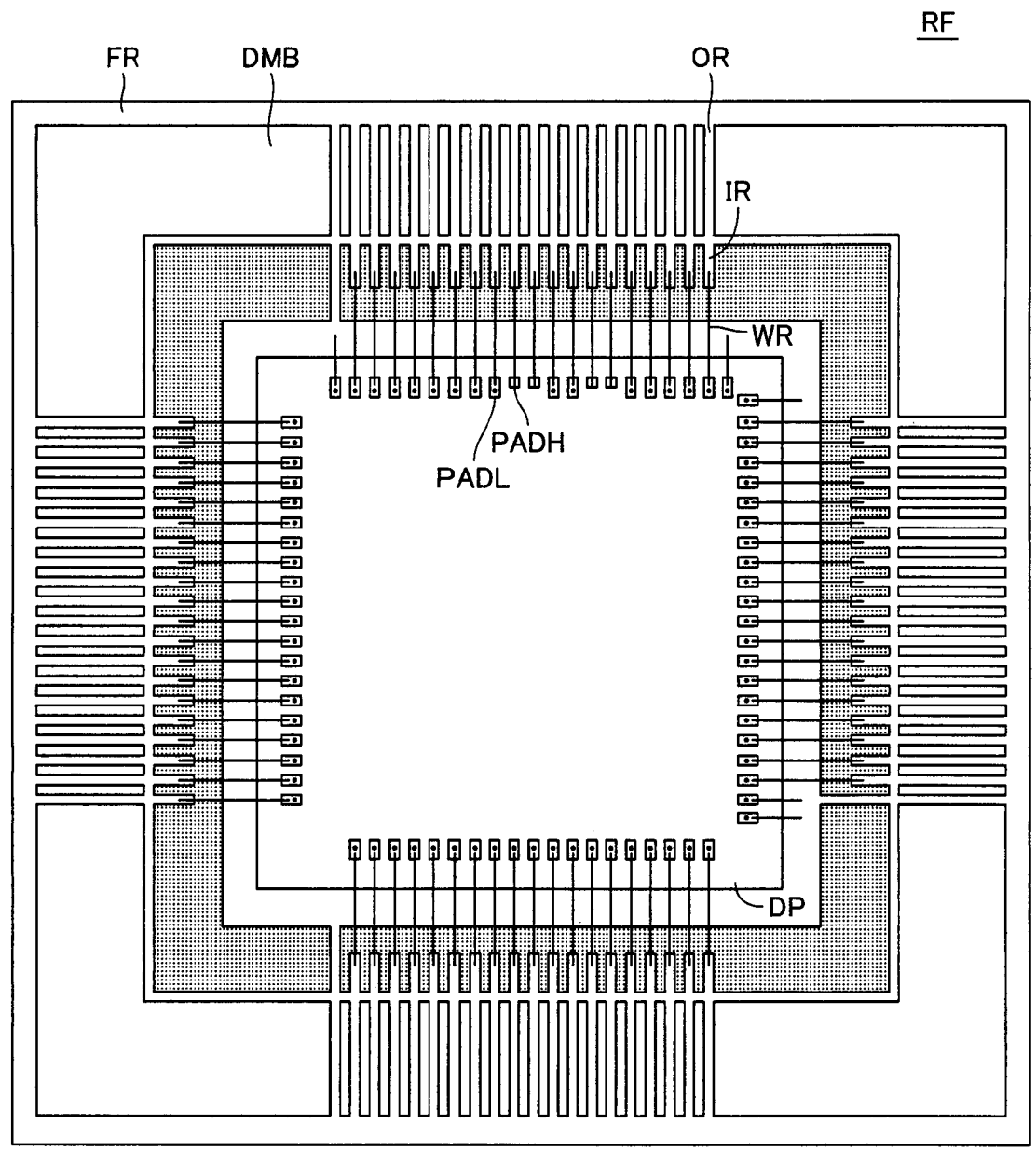
FIG. 6 is a plan view showing the state where the semiconductor chip is sealed.

FIG. 6 is a plan view showing the state where the semiconductor chip is sealed. With reference to FIG. 6, the resin seal of the semiconductor chip CP is performed by the transfer molding method, for example. Plating processing of the outer lead OR is performed by lead free plating which uses tin as the main ingredients.

Figure 7:
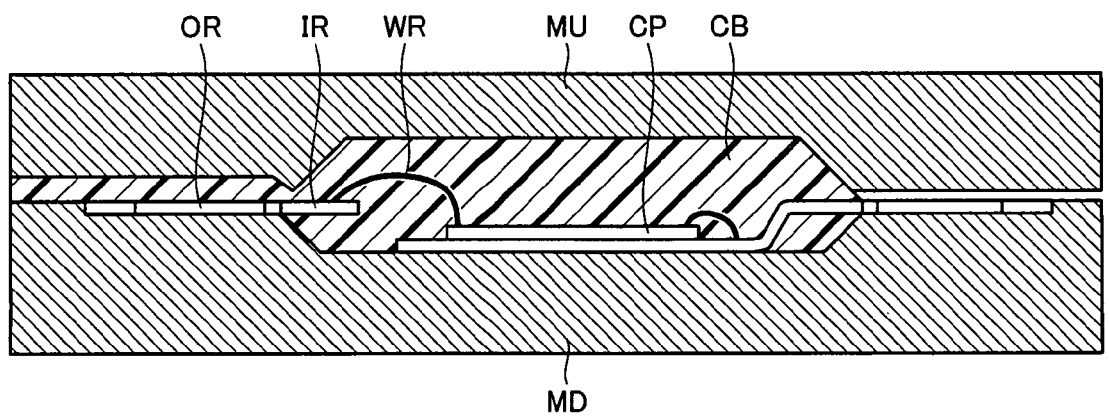
FIG. 7 is a cross-sectional view showing the state where the metallic mold is set to the semiconductor chip and the lead frame.
Figure 8:
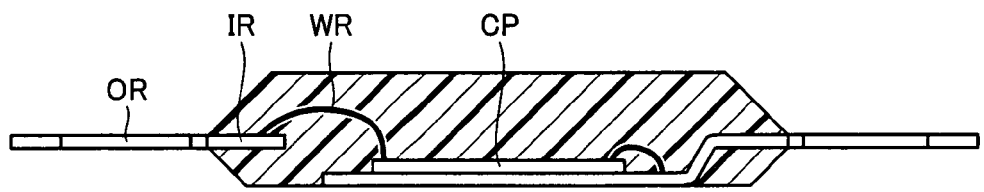
FIG. 8 is a cross-sectional view showing the semiconductor chip and lead frame which are sealed.

FIG. 7 is a cross-sectional view showing the state where the metallic mold is set to the semiconductor chip and the lead frame. FIG. 8 is a cross-sectional view showing the semiconductor chip and lead frame which are sealed.

With reference to FIG. 7 and FIG. 8, lead frame RF on which semiconductor chip CP is pasted is installed in cavity CB formed by combining upper-die MU and lower-die MD. And a sealing agent is injected into cavity CB. After a sealing agent heat-hardens, upper-die MU and lower-die MD are separated, and mold goods are taken out.

Figure 9:
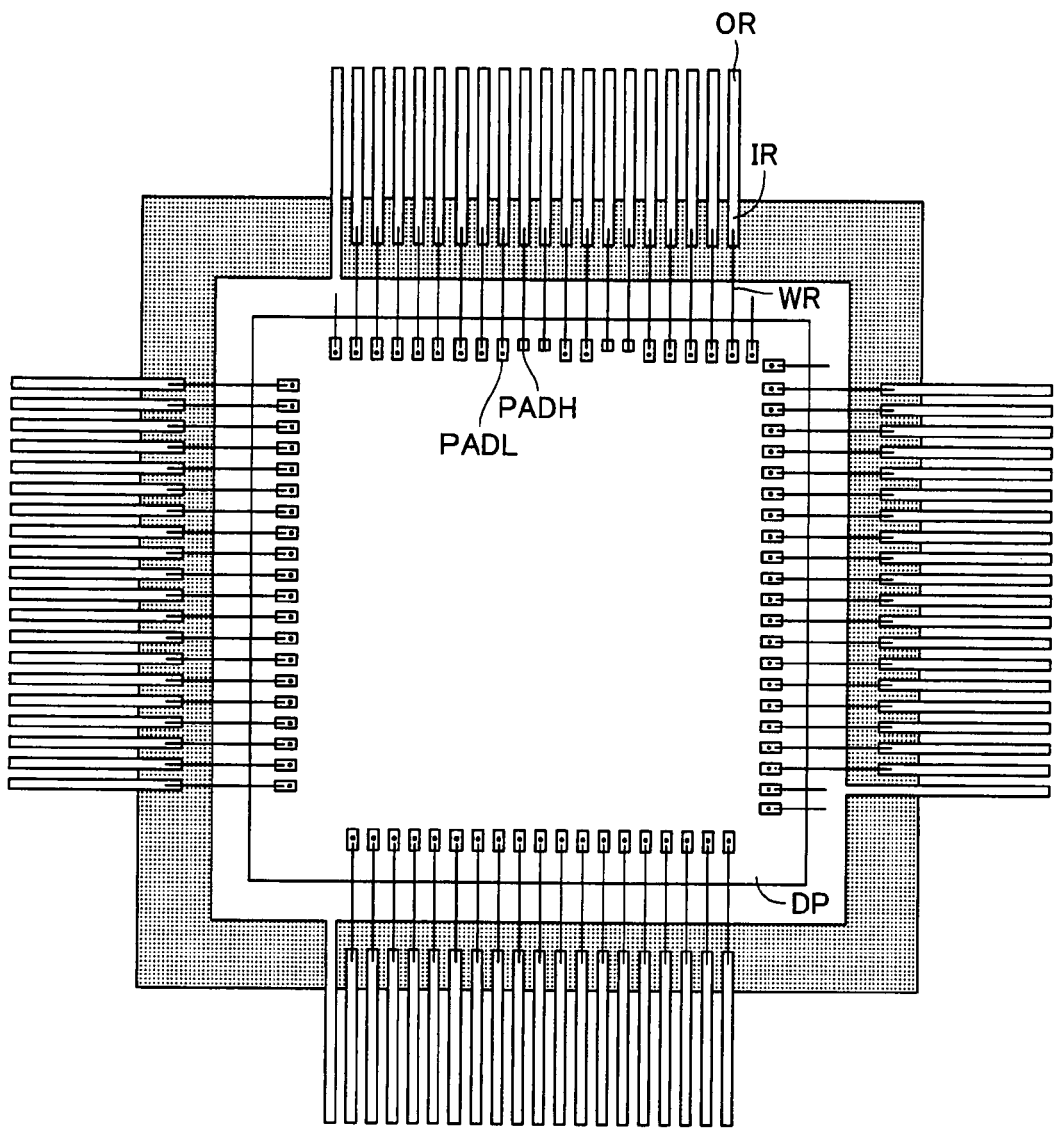
FIG. 9 is a plan view showing the state where the semiconductor chip and lead frame which are sealed are formed further.

FIG. 9 is a plan view showing the state where the semiconductor chip and lead frame which are sealed are formed further.

After semiconductor chip CP and lead frame RF are sealed with reference to FIG. 9, frame part FR and dam bar DB in lead frame RF are cut.

Figure 10:
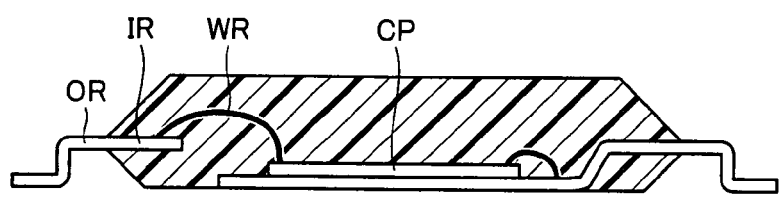
FIG. 10 is a cross-sectional view showing the completed semiconductor package.
Figure 11:
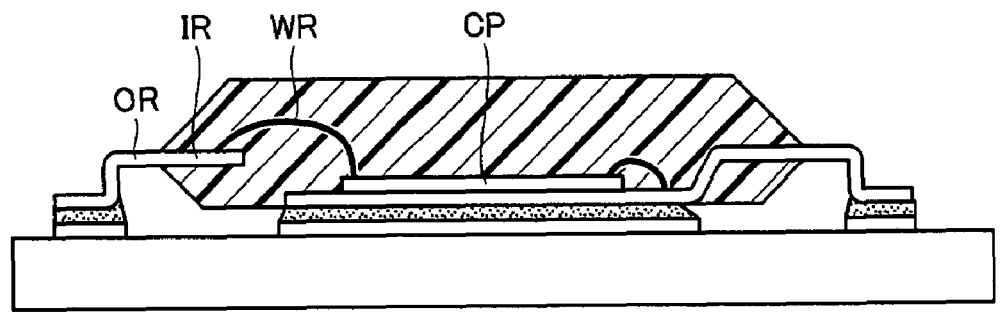
FIG. 11 is a cross-sectional view showing the state where the completed semiconductor package is mounted in the wiring substrate.

FIG. 10 is a cross-sectional view showing the completed semiconductor package. FIG. 11 is a cross-sectional view showing the state where the completed semiconductor package is mounted on the wiring substrate.

After frame part FR and dam bar DB in lead frame RF are cut with reference to FIG. 10, outer lead OR is bent. According to the above steps, a semiconductor package is manufactured from a semiconductor integrated circuit.

With reference to FIG. 11, soldering connection of the completed semiconductor package is performed, for example on a mother board, i.e., a wiring substrate.

[Test Method]

Next, the test method of the semiconductor device concerning an embodiment of the invention is explained.

Figure 12:
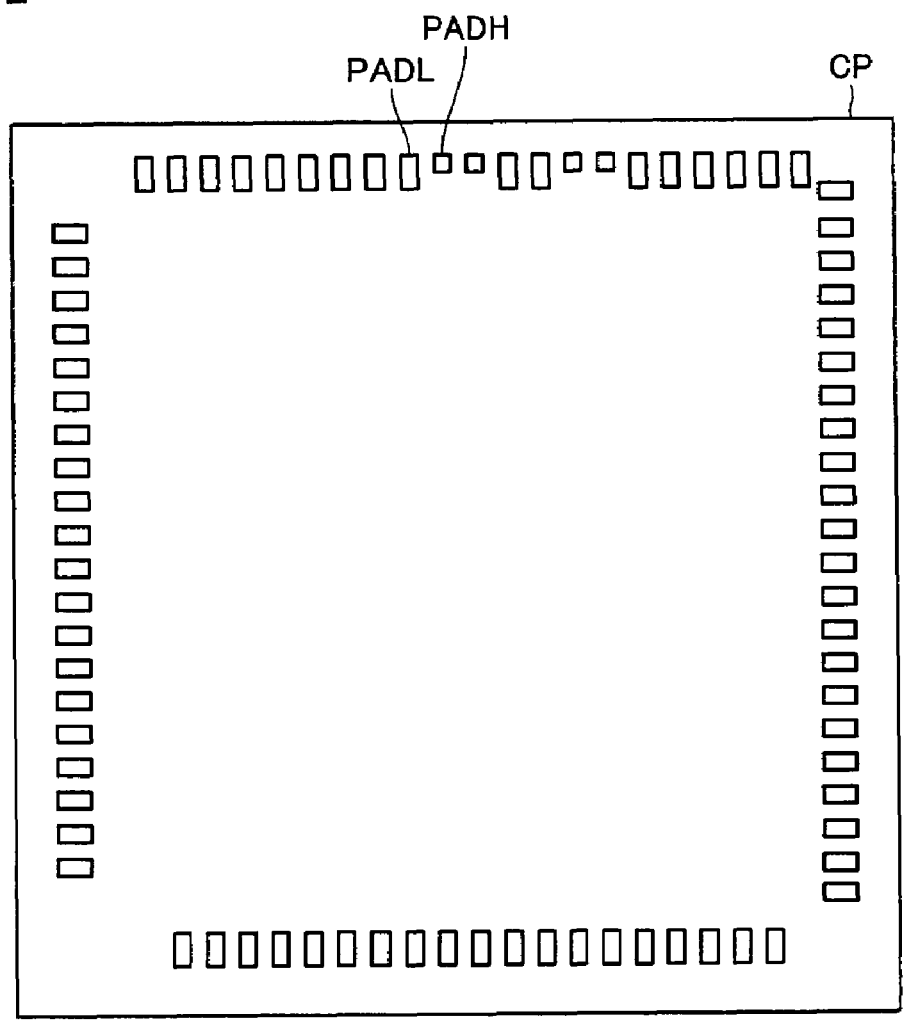
FIG. 12 is a plan view showing the structure of the semiconductor chip on a semiconductor wafer notionally.
Figure 13:
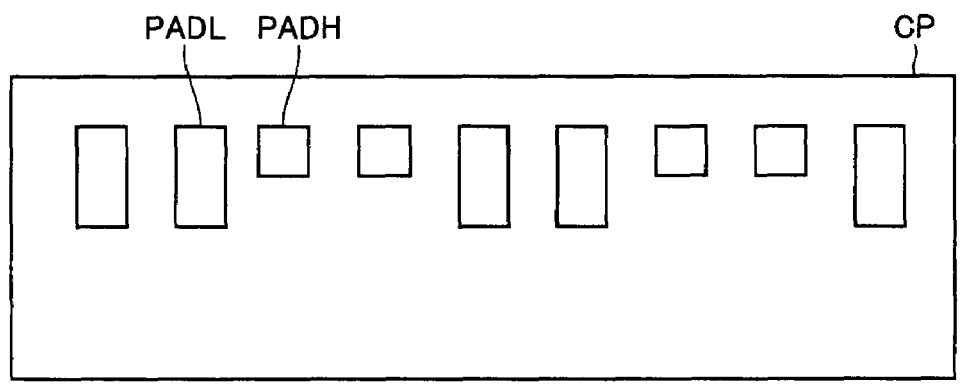
FIG. 13 is the drawing which expanded the pad section in the semiconductor chip on a semiconductor wafer.

FIG. 12 is a plan view showing the structure of the semiconductor chip on a semiconductor wafer notionally. FIG. 13 is the drawing which expanded the pad section in the semiconductor chip on a semiconductor wafer.

With reference to FIG. 12 and FIG. 13, the pad section in semiconductor chip CP is provided with bonding pad PADH for high speed signals and bonding pad PADL for low-speed signals.

Bonding pad PADH is a pad for high-speed differential signals of 1 Gbps or more in the maximum data transfer rate, i.e., 500 MHz or more in the maximum frequency. The pad section in semiconductor chip CP includes at least bonding pads PADH1 and PADH2 corresponding to each of external output terminals TX+ and TX− for high-speed differential signals which are mentioned later, and bonding pads PADH3 and PADH4 corresponding to each of external input terminals RX+ and RX− for high-speed differential signals which are mentioned later. The size of bonding pad PADH is 53 μm×53 μm. Bonding pad PADL is a pad for the low-speed signals of 300 Mbps or less in the maximum data transfer rate, and the size is 53 μm×115 μm.

By such structure, a bonding pad can be made into a suitable size according to a use. That is, compared with bonding pad PADL, the parasitic capacitance to a pad can be reduced by about 2 pF by miniaturizing bonding pad PADH for high speed signals. By enlarging the area of bonding pad PADL for low-speed signals compared with bonding pad PADH for high speed signals, a bonding wire can be pasted up avoiding the region in which the blemish was generated by applying a probe, and lowering of bond strength can be prevented.

Figure 14:
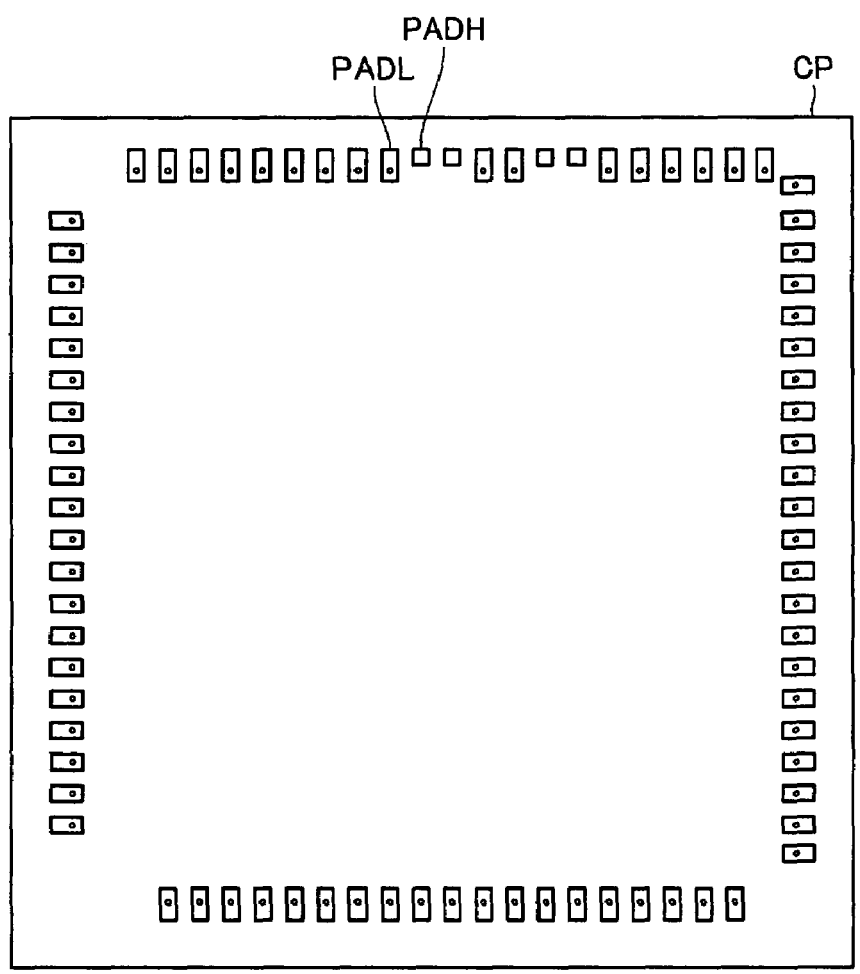
FIG. 14 is a plan view showing the state of the semiconductor chip after conducting test using a probe to a semiconductor chip.

FIG. 14 is a plan view showing the state of the semiconductor chip after conducting inspection using a probe to a semiconductor chip.

As for the manufacturing method of the semiconductor device concerning the first embodiment of the present invention, in wafer test WT which is the test in the state (it is also hereafter called a wafer state.) where a plurality of semiconductor integrated circuits were formed on semiconductor wafer WH, the DC test and AC test of an interface circuitry for low-speed signals are performed. With reference to FIG. 14, the blemish to which the probe was applied has occurred in bonding pad PADL. By such structure, in a wafer state, the good or bad of the semiconductor integrated circuit regarding the interface circuitry for low-speed signals can be judged, and it can prevent manufacture of a semiconductor package becoming useless.

Figure 24:
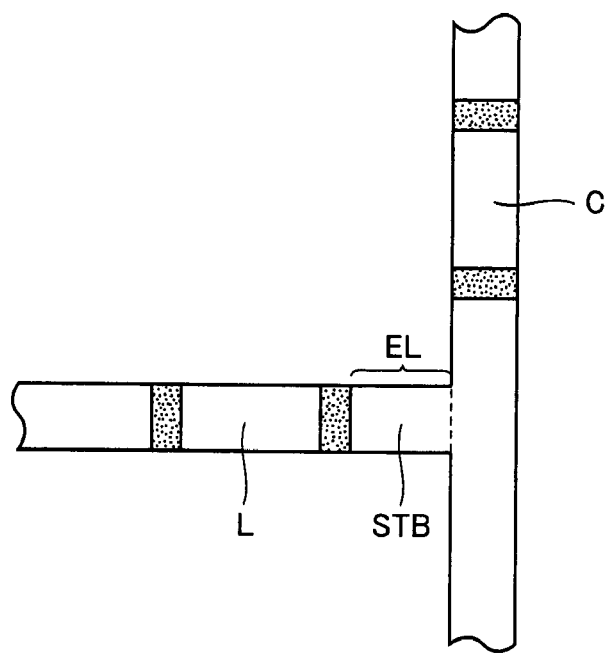
FIG. 24 is a plan view showing arrangement of the coil in the DUT board concerning the first embodiment of the present invention.

About the test method of the semiconductor device which uses a probe, the structure of the probe is shown, for example in the FIG. 1 of Japanese Patent Laying-Open No. 2005-136246. A state that a probe is applied to the pad of a semiconductor device is shown in FIG. 24 etc.

Figure 15:
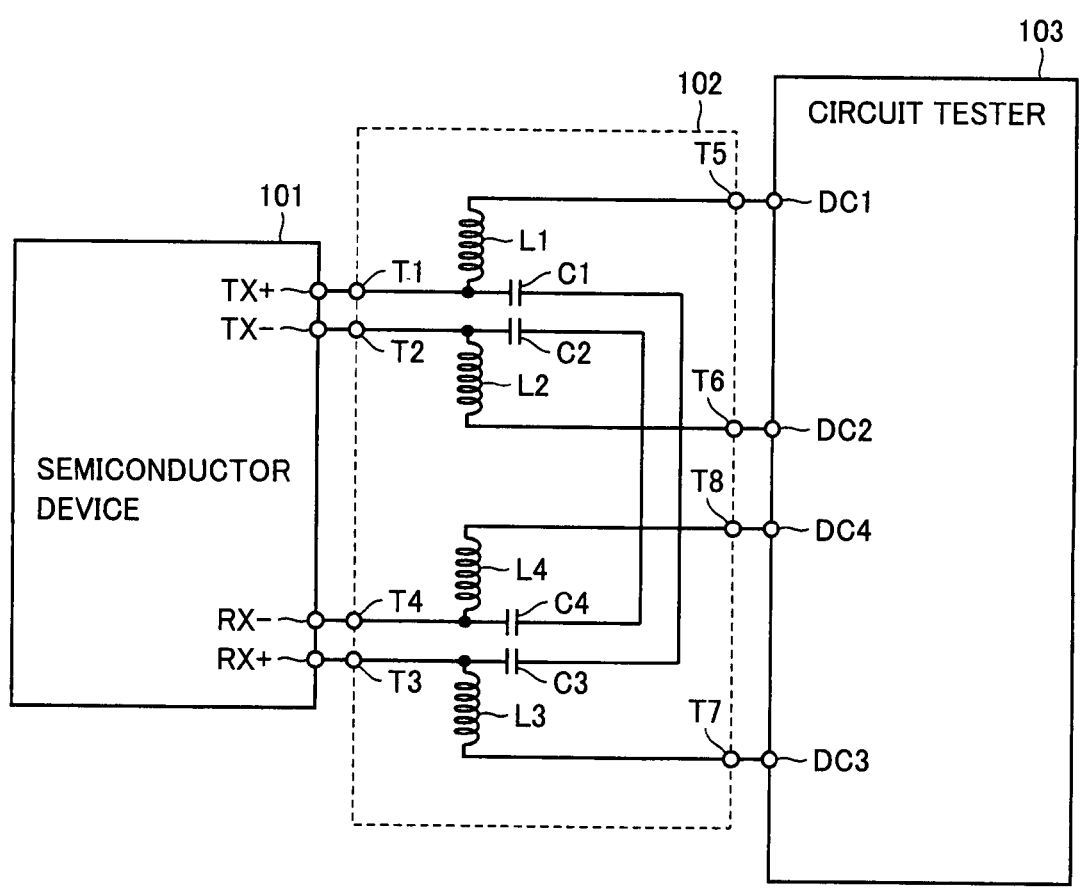
FIG. 15 is a drawing for explaining the manufacturing method of the semiconductor device concerning the first embodiment of the present invention.

FIG. 15 is a drawing for explaining the manufacturing method of the semiconductor device concerning the first embodiment of the present invention. With reference to FIG. 15, semiconductor device 101 which is a test objective, DUT (Device Under Test) board (testing device) 102, and circuit tester 103 are used by the manufacturing method of this semiconductor device.

Semiconductor device 101 is provided with external output terminal TX+ and TX− for high-speed differential signals, and external input terminal RX+ and RX− for high-speed differential signals. External output terminal TX and external input terminal RX are equivalent to the above-mentioned outer lead OR.

DUT board 102 is provided with input terminal T1 and T2 for devices, output terminal T3 and T4 for devices, output terminals T5-T8 for circuit testers, capacitors (first element) C1-C4, and coils (the second element or the third element) L1-L4. Circuit tester 103 is provided with DC test terminals DC1-DC4.

In the manufacturing method of this semiconductor device, when performing the DC test and AC test of an interface circuitry for high speed signals, semiconductor device 101, DUT board (testing device) 102, and circuit tester 103 are electrically connected first. Input terminal T1 and T2 for devices is connected more to a detail at external output terminal TX+ and TX− of semiconductor device 101, respectively. Output terminal T3 and T4 for devices is connected to external input terminal RX+ and RX− of semiconductor device 101, respectively. Output terminals T5-T8 for circuit testers are connected to DC test terminals DC1-DC4 of circuit tester 103, respectively.

As for capacitor C1, input terminal T1 for devices is connected to one end. As for capacitor C3, output terminal T3 for devices is connected to one end, and the other end of capacitor C1 is connected to the other end. As for capacitor C2, input terminal T2 for devices is connected to one end. As for capacitor C4, output terminal T4 for devices is connected to one end, and the other end of capacitor C2 is connected to the other end.

As for coil L1, input terminal T1 for devices is connected to one end, and output terminal T5 for circuit testers is connected to the other end. As for coil L2, input terminal T2 for devices is connected to one end, and output terminal T6 for circuit testers is connected to the other end. As for coil L3, output terminal T3 for devices is connected to one end, and output terminal T7 for circuit testers is connected to the other end. As for coil L4, output terminal T4 for devices is connected to one end, and output terminal T8 for circuit testers is connected to the other end.

Capacitors C1 and C2 attenuate a direct-current component among the frequency components of the signal received from the driver circuit with which semiconductor device 101 is provided, and which is not illustrated. Capacitors C3 and C4 attenuate a direct-current component among the frequency components of the signal which passed capacitors C1 and C2.

Coils L1 and L2 attenuate the alternating current component which leaks from semiconductor device O1 toward output terminals T5 and T6 for circuit testers of testing device 102, for example. Coils L3 and L4 attenuate the alternating current component which leaks from semiconductor device 101 toward output terminals T7 and T8 for circuit testers of testing device 102, for example.

In the manufacturing method of the semiconductor device concerning the first embodiment of the present invention, the DC test and AC test of an interface circuitry for high-speed differential signals are performed in final test FT.

In a DC test, the voltage at the side of the other end of coil L1-coil L4 is measured, respectively, and the good or bad of semiconductor device 101 is judged based on the measurement result. Concretely, the direct current voltage in DC test terminals DC1-DC4 is measured by circuit tester 103, respectively.

In an AC test, an alternating current signal is outputted from external output terminal TX+ and TX− of semiconductor device 101. The alternating current signal inputted into external input terminals RX+ and RX− of semiconductor device 101 via DUT board 102 is measured, and the good or bad of semiconductor device 101 is judged based on the measurement result. For example, the alternating current signal showing a predetermined test pattern is outputted from external output terminals TX+ and TX− of semiconductor device 101. The alternating current signal inputted into external input terminal RX+ and RX− of semiconductor device 101 and a predetermined test pattern are compared, and the good or bad of semiconductor device 101 is judged based on the matching result.

Figure 16:
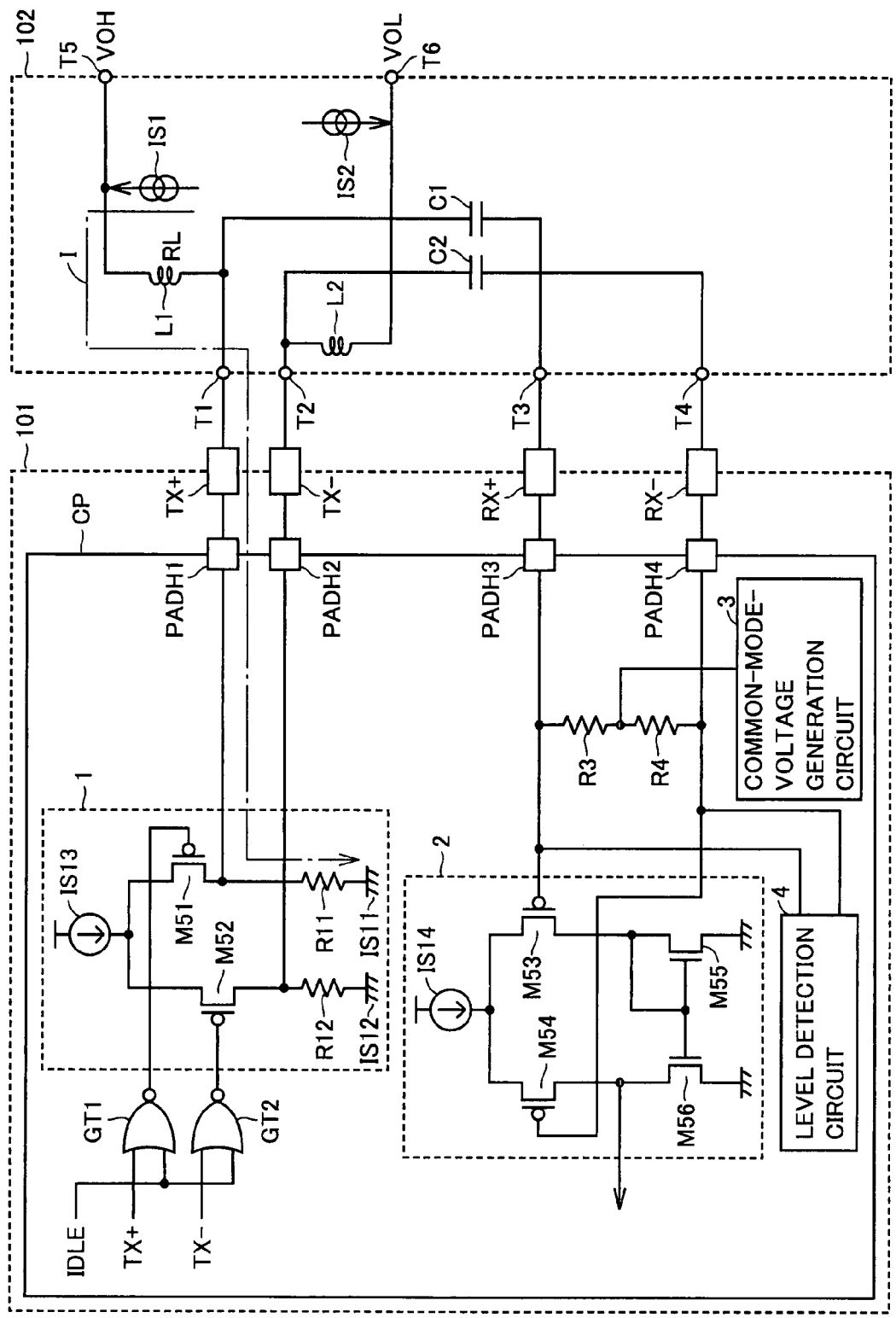
FIG. 16 is a drawing showing a state that the DC test of the driver circuit in the semiconductor device concerning the first embodiment of the present invention is performed.

FIG. 16 is a drawing showing a state that the DC test of the driver circuit in the semiconductor device concerning the first embodiment of the present invention is performed.

Semiconductor integrated circuit CP with reference to FIG. 16 has driver circuit 1 and receiver circuit 2 for high-speed differential signals, NOR circuits GT1 and GT2, resistance R3 and R4, common-mode-voltage generation circuit 3, level detection circuit 4, bonding pads PADH1 and PADH2 for high-speed differential signals (pad for output signals), and bonding pads PADH3 and PADH4 for high-speed differential signals (pad for input signals). Driver circuit 1 includes P channel MOS transistors M51 and M52, resistance R11 and R12, and current sources IS11-IS13. Receiver circuit 2 includes P channel MOS transistors M53 and M54, N channel MOS transistors M55 and M56, and current source IS14. DUT board 102 is further provided with current sources IS1 and IS2.

Common-mode-voltage generation circuit 3 gives electric potential required in order that receiver circuit 2 may receive normally the differential signal inputted via bonding pads PADH3 and PADH4 at the junction point of resistance R3 and R4.

Level detector 4 outputs a level lowering signal as the amplitude of the input signal of receiver circuit 2 becomes below a predetermined value. Hereby, in the state where the signal is not inputted into external input terminal RX+ and RX−, it can prevent processing a noise as an input signal accidentally in semiconductor device 101.

Signal IDLE is an output control signal of semiconductor device 101. More to a detail, when signal IDLE is high-level, P channel MOS transistors M51 and M52 will be in ON state, and a differential signal is no longer outputted from external output terminals TX+ and TX−.

In a DC test, 2 mA direct current I is sent through current source IS11, i.e., grounding electric potential, via resistance R11 of driver circuit 1, for example from current source IS1 of DUT board 102, and voltage VOH in output terminal T5 for circuit testers is measured. Here, trouble is in resistance R11, when the resistance of resistance R11 is larger than a designed value, the current supply of driver circuit 1 is insufficient, and voltage VOH becomes small. When it does so, the amplitude of the high-speed differential signal outputted from external output terminals TX+ and TX− becomes different from a designed value, and it will become impossible for the system incorporating semiconductor device 101 to operate normally. Therefore, when voltage VOH is less than a predetermined value, it judges with semiconductor device 101 being a defective unit.

Here, to the resistance which the transmission routes from the grounding electric potential which is current source IS11 in driver circuit 1 to bonding pad PADH1 including resistance R11 have when resistance RL of coil L1 is too large, since change of voltage VOH to change of the resistance of resistance R11 etc. becomes minute, it becomes difficult to detect the trouble of resistance R11 etc. in a DC test. Therefore, it is preferred that resistance RL of coil L1 is less than the resistance which the transmission routes from current source IS11 to bonding pad PADH1 in driver circuit 1 have. It is preferred that resistance RL of coil L1 is ¹⁄₁₀ or less of the resistance which the transmission routes from current source IS11 to bonding pad PADH1 have. For example, when the resistance which the transmission routes from current source IS11 to bonding pad PADH1 have is 50Ω, a coil is chosen so that resistance RL of coil L1 may constitute 0.2Ω.

In a DC test, sending a 2 mA direct current through current source IS12, i.e., grounding electric potential, via resistance R12 of driver circuit 1, for example from current source IS2 of DUT board 102, voltage VOH in output terminal T5 for circuit testers is measured. It is also possible to judge good or bad of semiconductor device 101, such as trouble of resistance R12, based on the measurement result.

Figure 17:
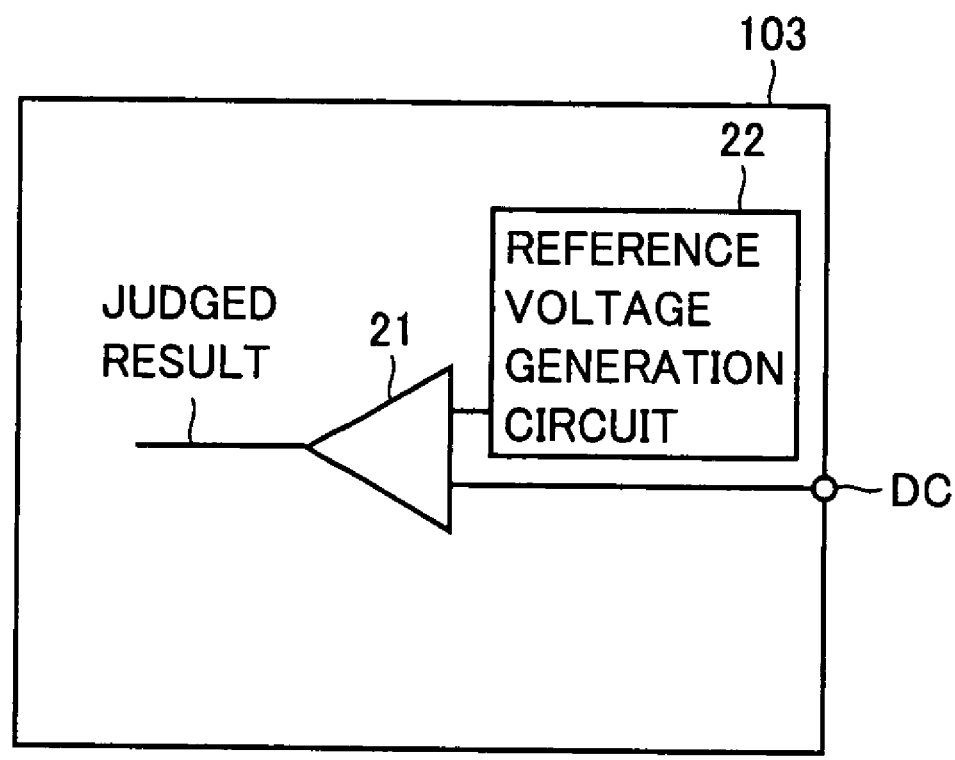
FIG. 17 is a drawing showing the structure of the direct-current-voltage judgment circuit in the circuit tester concerning the first embodiment of the present invention.

FIG. 17 is a drawing showing the structure of the direct-current-voltage judgment circuit in the circuit tester concerning the first embodiment of the present invention.

Circuit tester 103 is provided with comparator 21 and reference voltage generation circuit 22 with reference to FIG. 17.

Comparator 21 compares the voltage in DC test terminal DC with the reference voltage received from reference voltage generation circuit 22, and outputs the judged result signal of a logic H level or a logic L level. Based on any the logic level of a judged result signal is, it is judged whether semiconductor device 101 is a defective unit.

Figure 18:
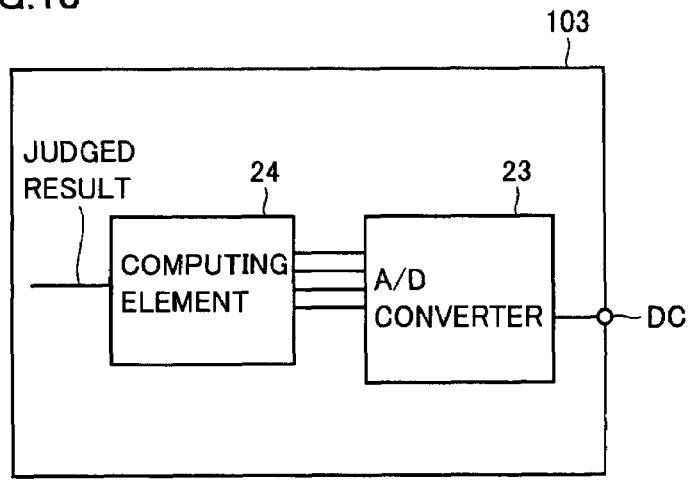
FIG. 18 is a drawing showing the structure of other examples of the direct-current-voltage judgment circuit in the circuit tester concerning the first embodiment of the present invention.

FIG. 18 is a drawing showing the structure of other examples of the direct-current-voltage judgment circuit in the circuit tester concerning the first embodiment of the present invention.

Circuit tester 103 is provided with A/D (Analog to Digital) converter 23 and computing element 24 with reference to FIG. 18.

A/D converter 23 changes the voltage value in DC test terminal DC into digital value, and outputs the resultant signal to computing element 24. Computing element 24 outputs a judged result signal based on the digital voltage value received from A/D converter 23.

Figure 19:
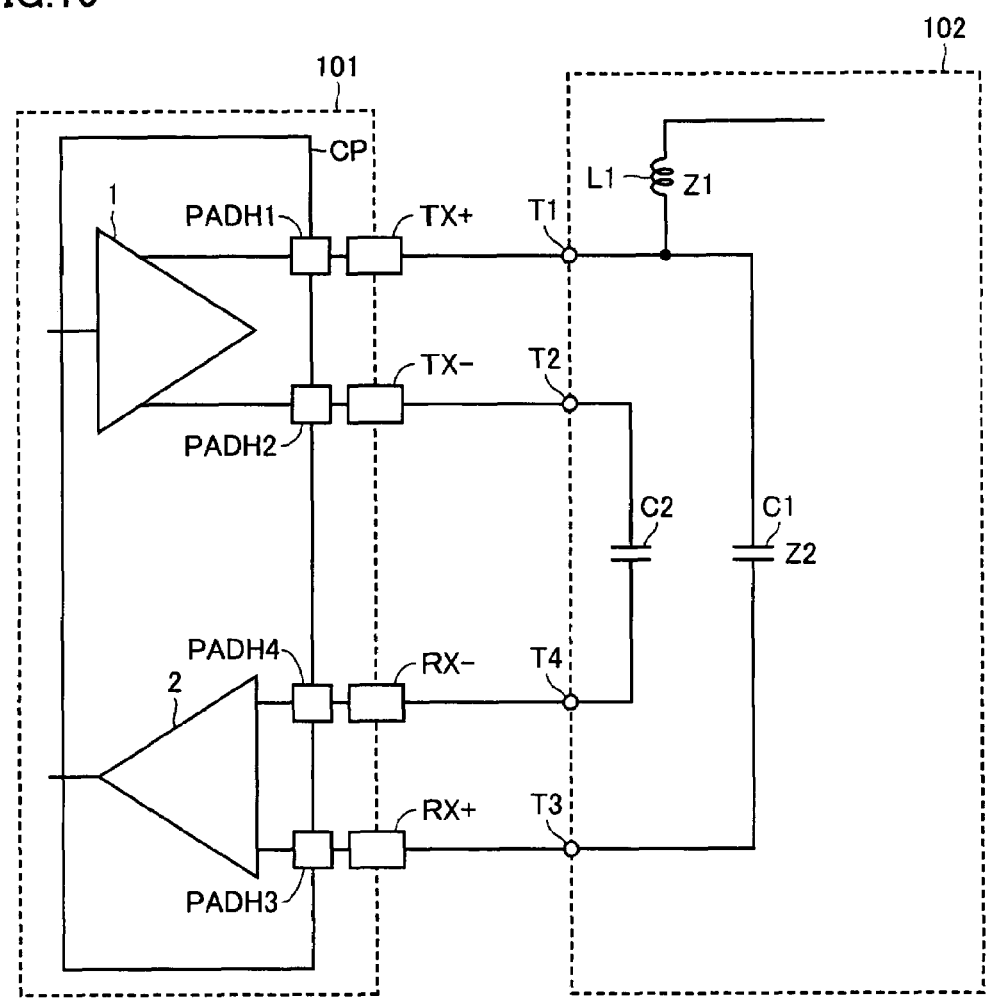
FIG. 19 is a drawing showing a state that an AC test is performed in the manufacturing method of the semiconductor device concerning the first embodiment of the present invention.

FIG. 19 is a drawing showing a state that an AC test is performed in the manufacturing method of the semiconductor device concerning the first embodiment of the present invention.

Semiconductor integrated circuit CP with reference to FIG. 19 has driver circuit 1 and receiver circuit 2 for high-speed differential signals, bonding pads PADH1 and PADH2 for high-speed differential signals (pad for output signals), and bonding pads PADH3 and PADH4 for high-speed differential signals (pad for input signals).

In an AC test, an alternating current signal is outputted via external output terminals TX+ and TX− of semiconductor device 101 from bonding pads PADH1 and PADH2 of semiconductor integrated circuit CP. And the alternating current signal inputted into bonding pads PADH3 and PADH4 of semiconductor device 101 via DUT board 102, and external input terminals RX+ and RX− of semiconductor device 101 is measured. For example, the alternating current signal showing a predetermined test pattern which has frequency equivalent to the signal in the normal operation of semiconductor device 101 is outputted from driver circuit 1. The signal which receiver circuit 2 outputs, and a predetermined test pattern are compared, and the good or bad of semiconductor device 101 is judged based on the matching result.

Here, when impedance Z1 of coil L1 in the frequency band of the alternating current signal outputted from driver circuit 1 is not large enough compared with impedance Z2 of capacitor C1, an alternating current signal will decline greatly and it will become impossible to do the AC test of a semiconductor device correctly. Therefore, it is preferred that it is the structure with sufficiently large impedance Z1 of coil L1 in the frequency band of an alternating current signal compared with impedance Z2 of capacitor C1.

For example, as for coil L1, the coil is chosen so that impedance Z1 of coil L1 to the 5 time higher harmonic wave of the maximum frequency of the output signal of semiconductor device 101 may become 100 or more times of impedance Z2 of capacitor C1. As for capacitor C1, the capacitor whose impedance Z2 to the maximum frequency of the output signal of semiconductor device 101 becomes in less than a predetermined value is chosen. For example, the capacitor of 2.2 nF-10 nF is chosen when the maximum data transfer rate of semiconductor device 101 is 6 Gbps.

Figure 20:
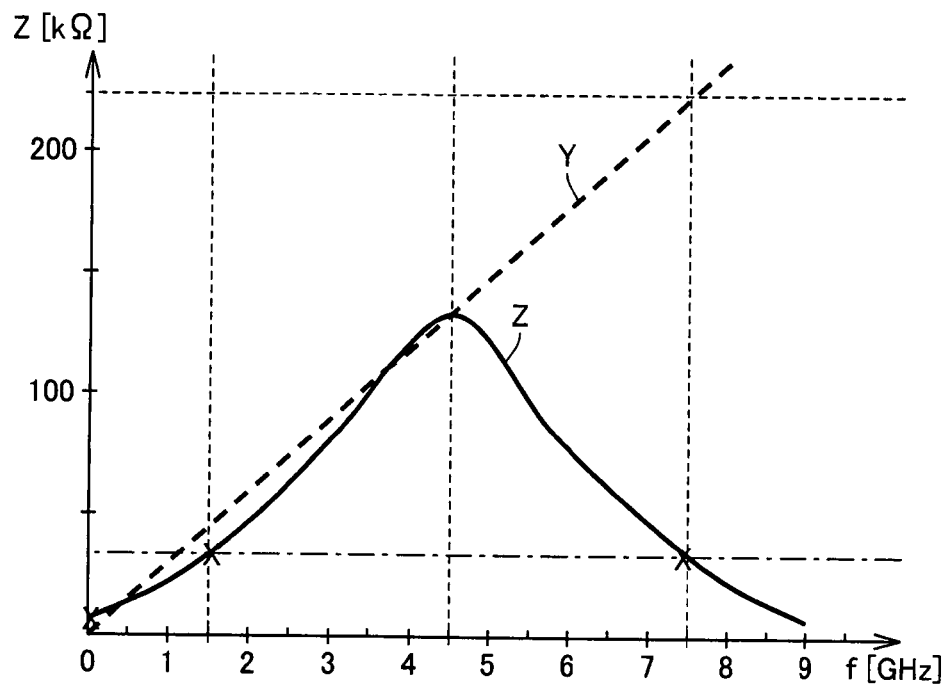
FIG. 20 is a drawing showing an example of the impedance characteristic of the coil in the DUT board concerning the first embodiment of the present invention.
Figure 21:
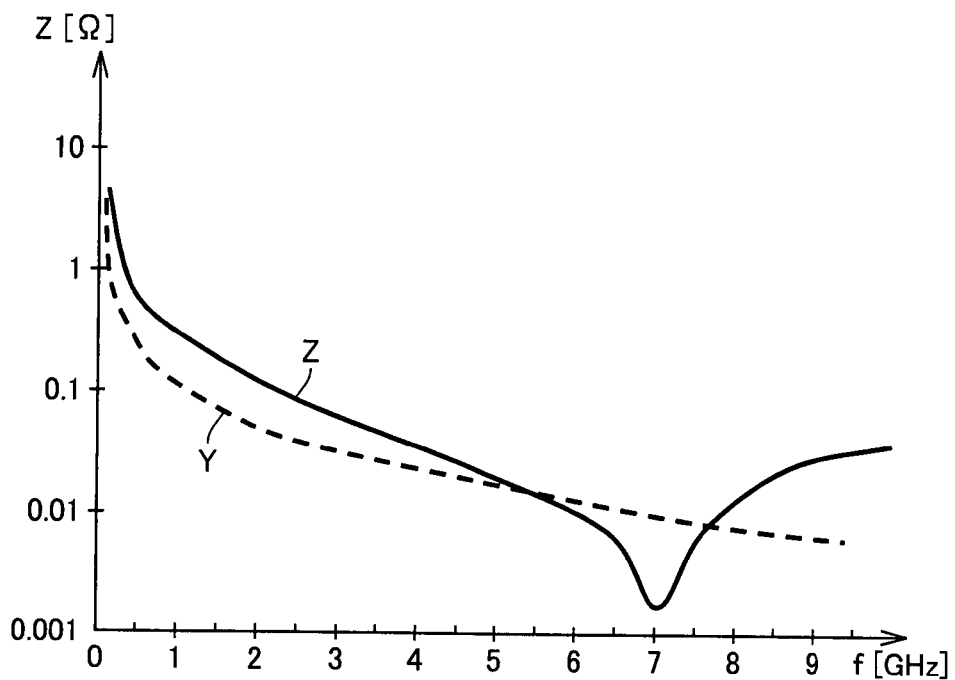
FIG. 21 is a drawing showing an example of the impedance characteristic of the capacitor in the DUT board concerning the first embodiment of the present invention.

FIG. 20 is a drawing showing an example of the impedance characteristic of the coil in the DUT board concerning the first embodiment of the present invention. FIG. 21 is a drawing showing an example of the impedance characteristic of the capacitor in the DUT board concerning the first embodiment of the present invention. Y is the graph showing the theoretical value of impedance, and Z is the graph showing the actual measurement value of impedance.

FIG. 20 shows the case where the winding type chip coil is used for coils L1-L4, and an inductance is made into 4.7 μH. FIG. 21 shows the case where the ceramic multilayer capacitor is used for capacitors C1-C4, and electric capacity is made into 10 nF.

Here, the case where the maximum data transfer rate of semiconductor device 101 is 3 Gbps, i.e. the case where the 5 time higher harmonic wave of a data wave form of semiconductor device 101 is 7.5 GHz is considered, for example. Although the theoretical value of the frequency characteristic of an inductance constitutes graph Y with reference to FIG. 20, it becomes graph Z actually under the influence of the parasitic capacitance of the coil. Although the theoretical value of the frequency characteristic of electric capacity constitutes graph Y with reference to FIG. 21, it becomes graph Z actually under the influence of the parasitism inductance of the capacitor. Therefore, the ratio of impedance Z1 of coil L1 and impedance Z2 of capacitor C1 to the signal which has the frequency of 7.5 GHz becomes small actually compared with a theoretical value. However, impedance Z1 of coil L1 to the signal which has the frequency of 7.5 GHz is 100 or more times of impedance Z2 of capacitor C1, and the AC test of a semiconductor device can be performed correctly.

Figure 22:
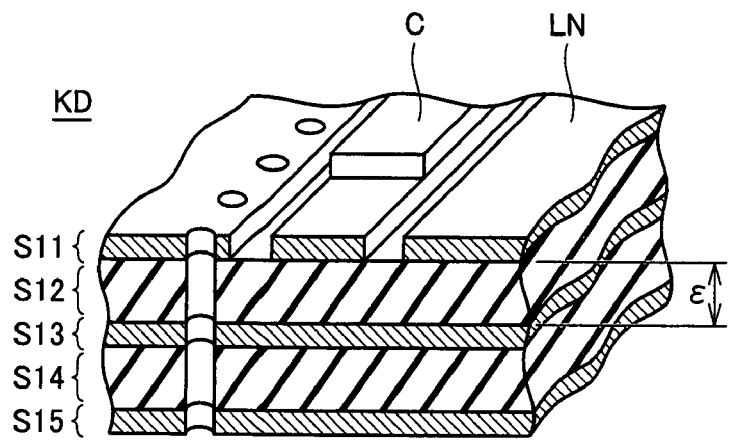
FIG. 22 is an outline view showing the wiring and capacitor in the DUT board concerning the first embodiment of the present invention.
Figure 23:
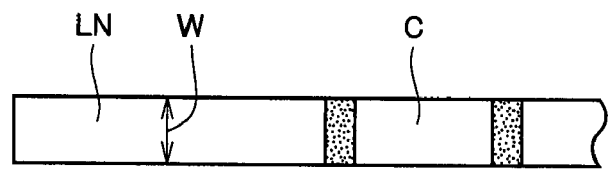
FIG. 23 is a plan view showing the wiring and capacitor in the DUT board concerning the first embodiment of the present invention.

FIG. 22 is an outline view showing the wiring and capacitor in the DUT board concerning the first embodiment of the present invention. FIG. 23 is a plan view showing the wiring and capacitor in the DUT board concerning the first embodiment of the present invention.

DUT board 102 is provided with substrate KD with reference to FIG. 22 and FIG. 23. Substrate KD includes metal layers S11 and S15, dielectric layers S12 and S14, and GND layer S13. Wiring LN is formed in metal layer S11. Capacitor C is arranged on wiring LN.

By adjusting dielectric constant $\in$ of dielectric layer S12 and width W of wiring LN, the characteristic impedance of the transmission line (wiring) in substrate KD can be unified into 50 Ω.

By forming capacitor C by the almost same width as wiring LN, it can prevent the characteristic impedance of a transmission line becoming discontinuous, and reflection of the output signal of semiconductor device 101 can be suppressed.

FIG. 24 is a plan view showing arrangement of the coil in the DUT board concerning the first embodiment of the present invention.

With reference to FIG. 24, stub STB is formed between the junction point of coil L and capacitor C, and coil L. Stub STB is formed more in a detail between the junction point of one end of coil L1, one end of capacitor C1, and input terminal T1 for devices of a DUT board, and one end of coil L1. Stub STB is formed between the junction point of one end of coil L2, one end of capacitor C2, and input terminal T2 for devices of a DUT board, and one end of coil L2. Stub STB is formed between the junction point of one end of coil L3, one end of capacitor C3, and output terminal T3 for devices of a DUT board, and one end of coil L3. Stub STB is formed between the junction point of one end of coil L4, one end of capacitor C4, and output terminal T4 for devices of a DUT board, and one end of coil L4.

Stub STB has structure which has the ⅛ or less length of the wavelength of the 5 time higher harmonic wave of the maximum frequency which the output signal of semiconductor device 101 has. That is, length EL of stub STB is formed so that $\lambda/8 = (1/8) \times (1/v) \times (c/(\sqrt{\in}))$ may be filled. Here, v is frequency, c is speed of light and $\in$ is a dielectric constant of dielectric layer S12. For example, when the maximum data transfer rate of semiconductor device 101 is 6 Gbps, the maximum frequency of the signal outputted from the output terminal of semiconductor device 101 is set to 3 GHz. When it does so, the 5 time higher harmonic wave of a data wave form of semiconductor device 101 will become 15 GHz, i.e., v=15 giga. It is $\in$=4. In this case, what is necessary is just to form stub STB which has length EL less than $\lambda/8$=1.25 mm. By such structure, the influence by reflection of the output signal of semiconductor device 101 can be reduced in the junction point of capacitor C and coil L.

By the way, when area of a bonding pad is enlarged in order to fully secure the region to which a probe is applied, and the region which pastes up a bonding wire, the parasitic capacitance to a bonding pad became large, and there was a problem that the AC characteristics of a semiconductor device will deteriorate. Here, this problem is explained using a drawing.

Figure 25:
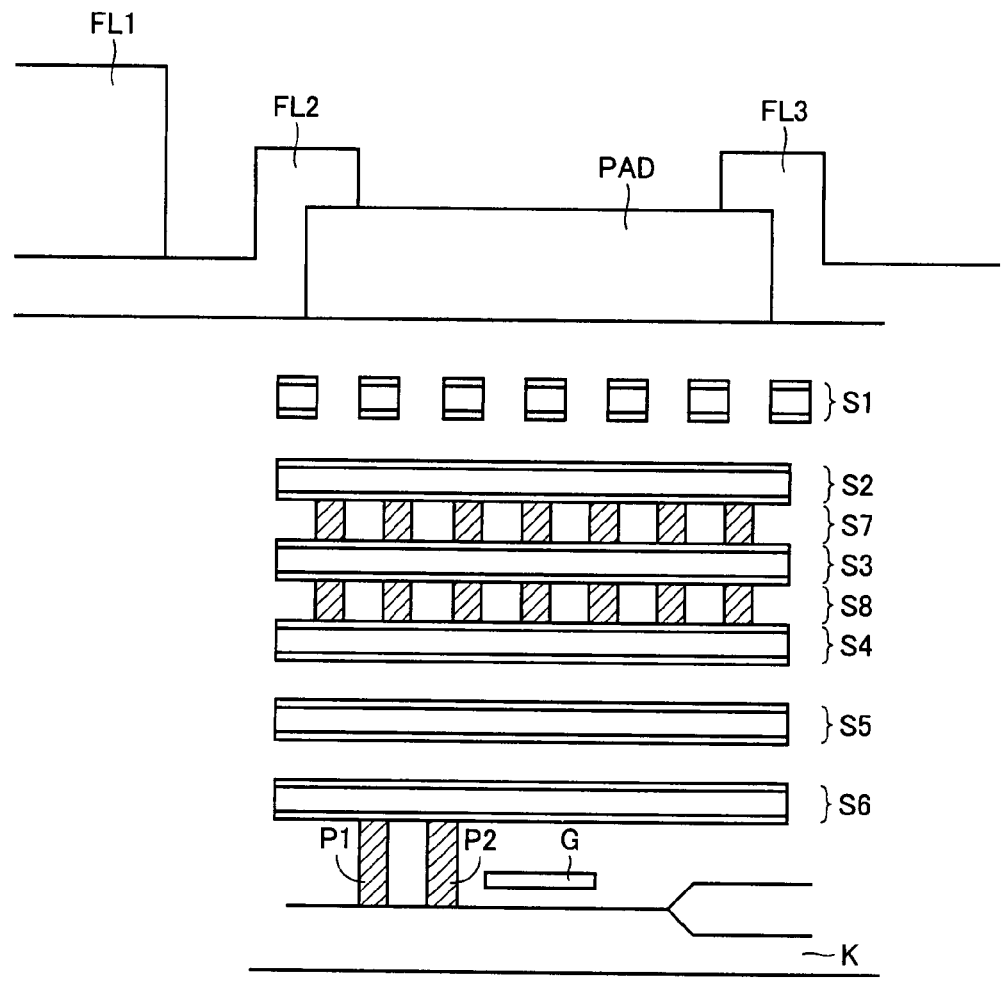
FIG. 25 is a drawing showing the section structure of the semiconductor device concerning the first embodiment of the present invention.

FIG. 25 is a drawing showing the section structure of the semiconductor device concerning the first embodiment of the present invention. With reference to FIG. 25, polyimide (PIQ) surface-protection insulating film FL1 and inorganic surface-protection insulating films FL2 and FL3 are formed around an aluminum wiring layer, i.e., bonding pad PAD, in semiconductor device 101. Internal wiring layers S1-S6 and interlayer insulation films S7-S8 are formed in the lower part to bonding pad PAD. Internal wiring layer S6 is electrically connected to silicon substrate K via plugs P1-P2. The semiconductor element which consists of gate electrode G etc. is formed on silicon substrate K.

Inorganic surface-protection insulating films FL2 and FL3 are a PSiN film and a TEOS film, for example. Interlayer insulation films S7-S8 are a SiCN film, a SiOF film, and a TEOS film, for example. Interlayer insulation films S7-S8 may be SiOC films of a low dielectric constant.

The conductor of different electric potential, i.e., a plurality of internal wiring layers, the semiconductor element which consists of a gate electrode etc., and silicon substrate K, is formed in the lower part to bonding pad PAD. Therefore, parasitic capacitance occurs between these conductors and bonding pad PAD. And parasitic capacitance becomes large as the area of bonding pad PAD becomes large.

However, DUT board 102 is provided with the capacitor which attenuates a direct-current component, and the coil which attenuates an alternating current component in the manufacturing method of the semiconductor device concerning the first embodiment of the present invention. And DUT board 102 and semiconductor device 101 are electrically connected. In a DC test, the good or bad of semiconductor device 101 is judged based on the result of having measured the voltage of the external output terminal or external input terminal of semiconductor device 101 via the coil. In an AC test, the loopback test which passes the alternating current through the capacitor in DUT board 102 and turns the alternating current signal outputted from semiconductor device 101 to semiconductor device 101 is performed. By such structure, both a DC test and an AC test can be performed in a final test process. Therefore, it becomes unnecessary to enlarge area of a bonding pad in order that a probe is applied in a wafer test process, and parasitic capacitance to bonding pad PADH can be made small, and degradation of the AC characteristics of a semiconductor device can be prevented. In a final test process, since an AC test and a DC test can be performed using a common DUT board, reduction of the number of manufacturing processes and manufacturing cost of a semiconductor device can be aimed at.

In the manufacturing method of the semiconductor device concerning the first embodiment of the present invention, in order to do a DC test and an AC test, it is not necessary to add an excessive circuit to the transmission route of the high-speed differential signal in semiconductor device 101. The increase in the parasitic capacitance by an additional circuit can be prevented, and degradation of the AC characteristics of a semiconductor device can be prevented.

[Modification 1 of a DUT Board]

Figure 26:
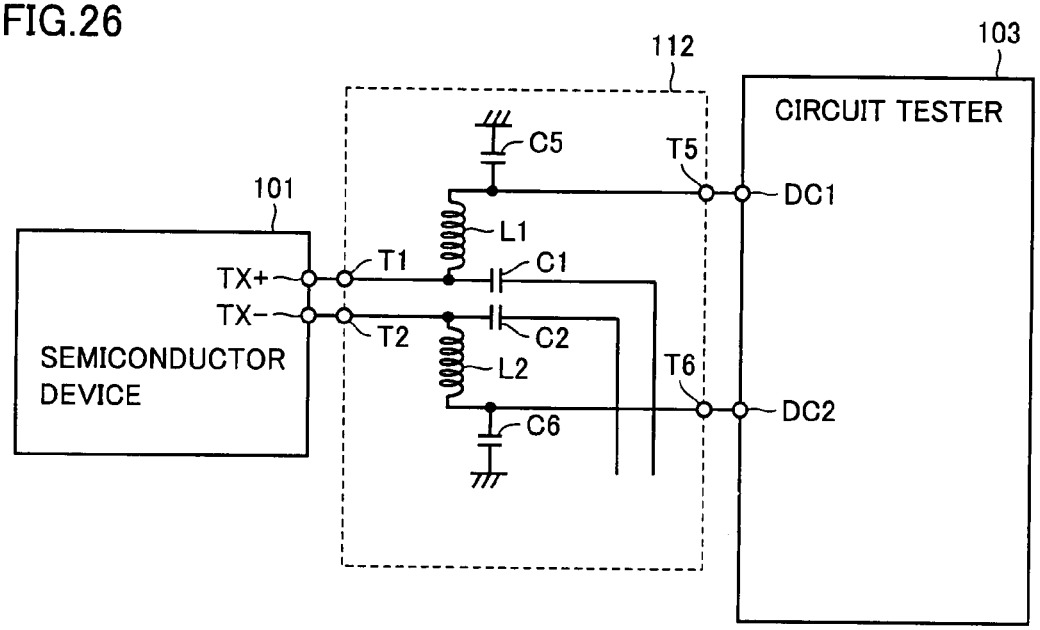
FIGS. 26 to 30 are drawings showing the structure of the modification of the DUT board concerning the first embodiment of the present invention.

FIG. 26 is a drawing showing the structure of the modification of the DUT board concerning the first embodiment of the present invention.

With reference to FIG. 26, DUT board 112 is further provided with capacitors C5-C6 to DUT board 102.

As for capacitor C5, one end is connected to the other end of coil L1, and output terminal T5 for circuit testers. As for capacitor C6, one end is connected to the other end of coil L2, and output terminal T6 for circuit testers. The other end of capacitor C5 and the other end of capacitor C6 are connected to grounding electric potential.

Capacitor C5 attenuates an alternating current component among the frequency components of the signal which passed coil L1. Capacitor C6 attenuates an alternating current component among the frequency components of the signal which passed coil L2.

By such structure, in the DC test of a semiconductor device, the alternating current component which constitutes a noise to the voltage measured by the other end side of each coil, i.e., the direct current voltage measured by circuit tester 103, can be reduced further, and the DC test of a semiconductor device can be performed correctly.

[Modification 2 of a DUT Board]

Figure 27:
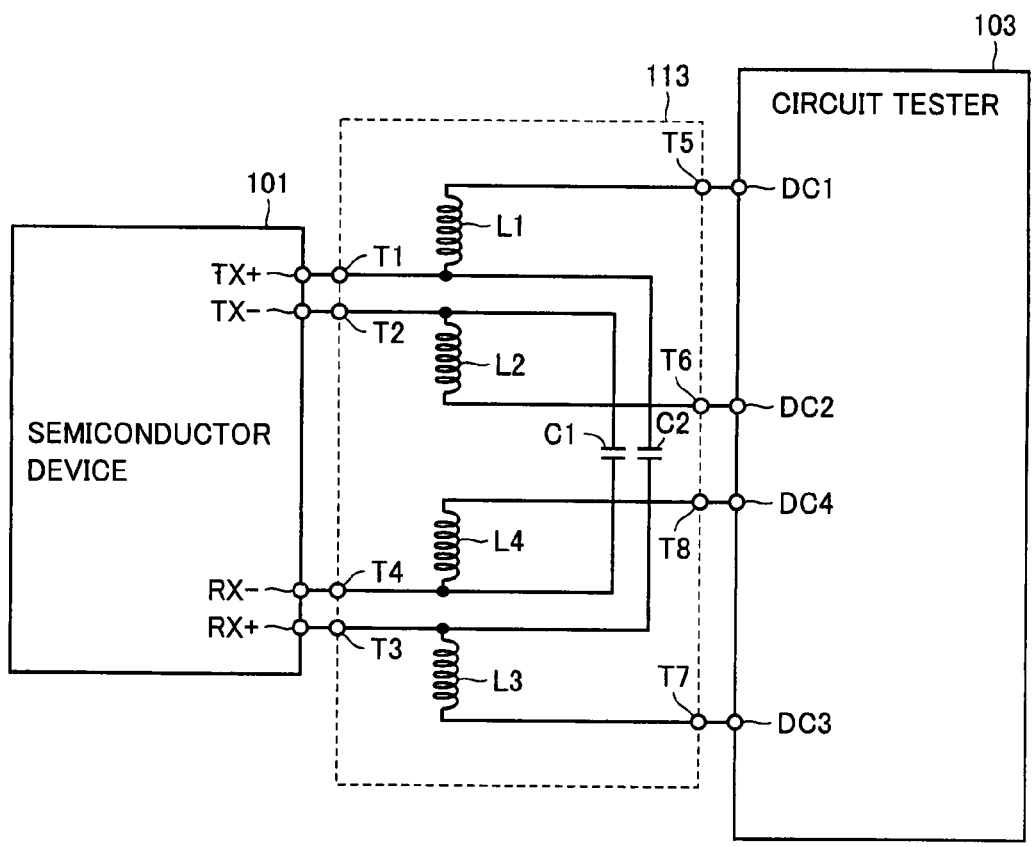

FIG. 27 is a drawing showing the structure of the modification of the DUT board concerning the first embodiment of the present invention.

With reference to FIG. 27, DUT board 113 is structure which is not provided with capacitors C3-C4 to DUT board 102.

Even if it is such structure, the direct-current component between the external output terminal and external input terminal of semiconductor device 101 can be stopped. Therefore, it is possible to do the DC test of driver circuit 1 and the DC test of receiver circuit 2 in semiconductor device 101.

[Modification 3 of a DUT Board]

Figure 28:
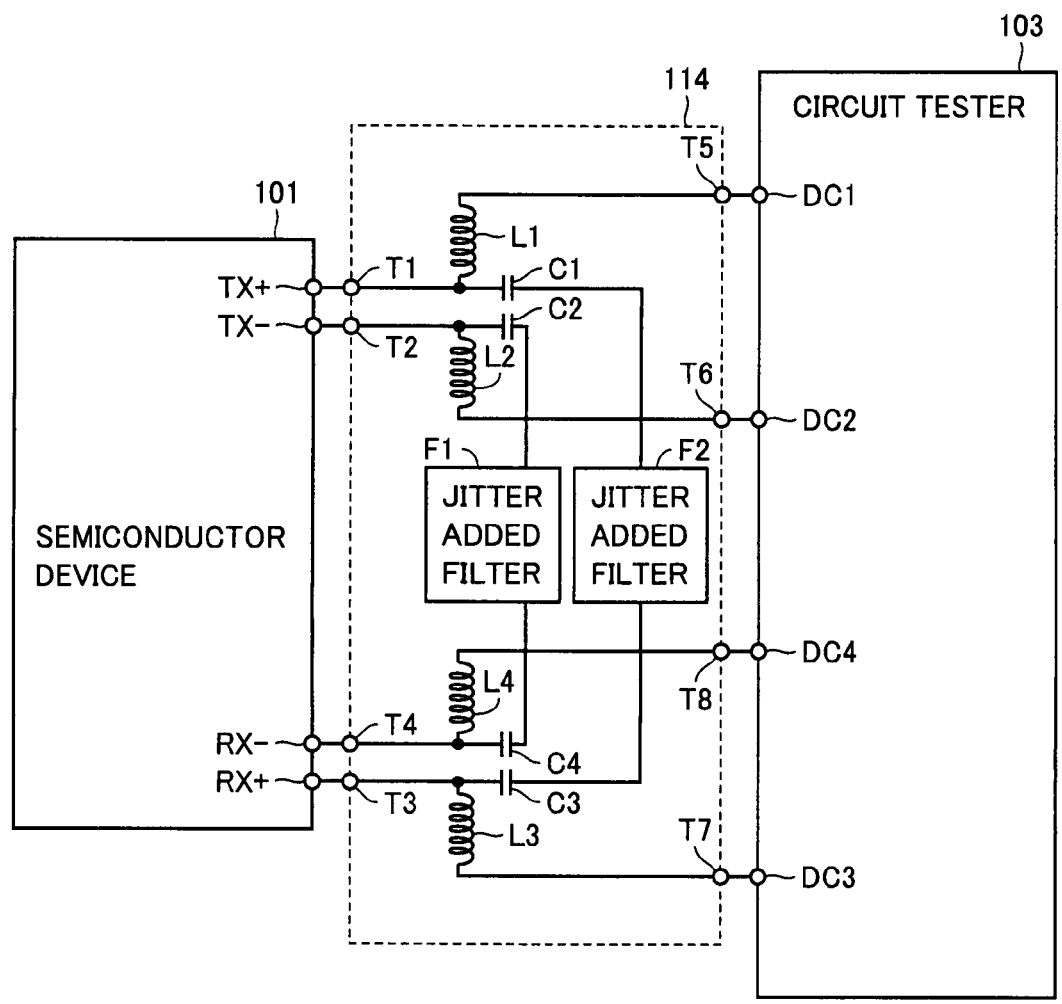

FIG. 28 is a drawing showing the structure of the modification of the DUT board concerning the first embodiment of the present invention.

With reference to FIG. 28, DUT board 114 is provided with jitter added filters F1-F2 which are low pass filters of a Bessel type further, for example to DUT board 102.

Jitter added filter F1 adds and outputs a jitter to the alternating current signal from semiconductor device 101 which passed capacitor C1. Jitter added filter F2 adds a jitter to the alternating current signal from semiconductor device 101 which passed capacitor C2 and outputs the resultant signal. Jitter added filters F1 and F2 may be structures in which the alternating current signal from semiconductor device 101 which passed capacitors C1 and C2 is made distorted, and the distorted signal is outputted.

Thus, by performing the AC test of a semiconductor device using a jitter added filter, the signal wave form in the system by which a semiconductor device is actually incorporated can be reproduced, and the AC test of a semiconductor device can be performed appropriately. On the high-speed transmission track in a semiconductor device, it becomes unnecessary to arrange a jitter added filter, and the characteristic degradation of the high-speed differential signal of a semiconductor device can be prevented.

[Modification 4 of a DUT Board]

Figure 29:
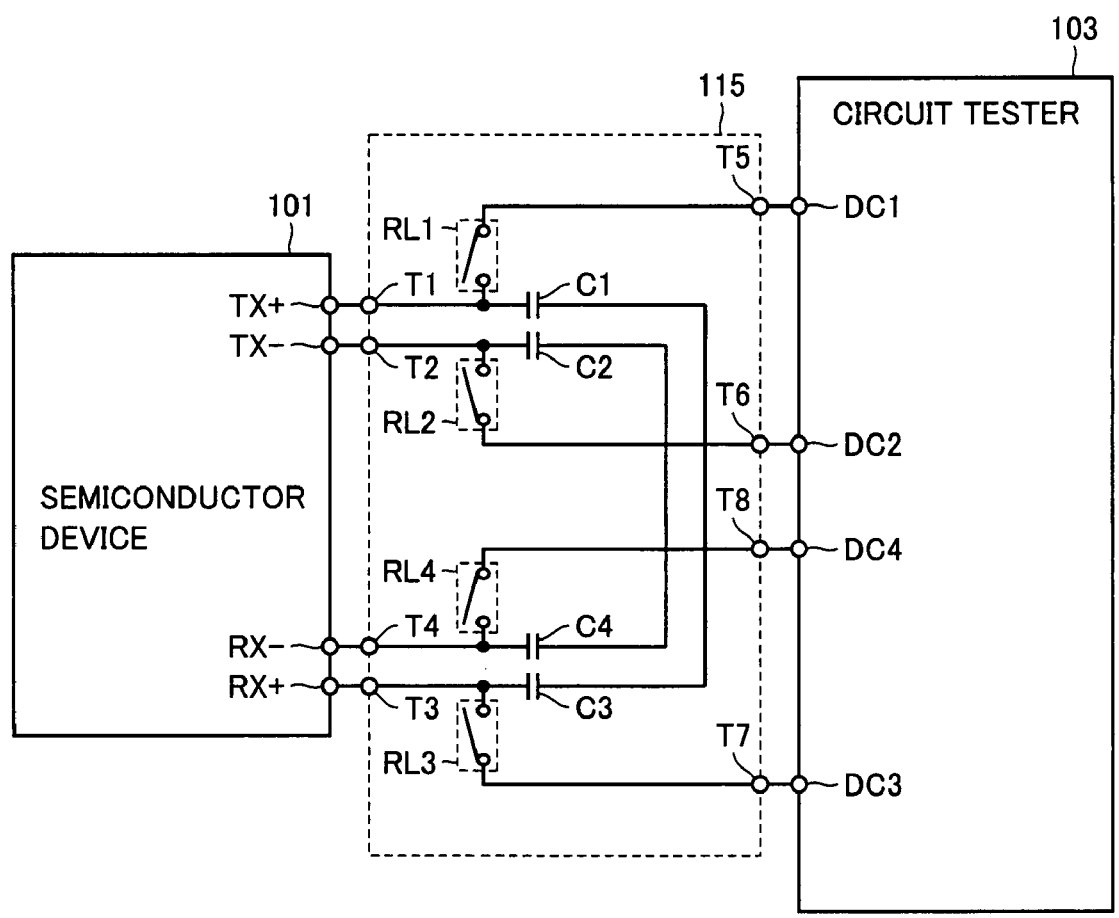

FIG. 29 is a drawing showing the structure of the modification of the DUT board concerning the first embodiment of the present invention.

With reference to FIG. 29, DUT board 115 is provided with relays RL1-RL4 instead of coils L1-L4 to DUT board 102.

As for relay RL1, input terminal T1 for devices is connected to one end, and output terminal T5 for circuit testers is connected to the other end. As for relay RL2, input terminal T2 for devices is connected to one end, and output terminal T6 for circuit testers is connected to the other end. As for relay RL3, output terminal T3 for devices is connected to one end, and output terminal T7 for circuit testers is connected to the other end. As for relay RL4, output terminal T4 for devices is connected to one end, and output terminal T8 for circuit testers is connected to the other end.

In a DC test, the electrical connection of relay RL1-relay RL4 is performed, the direct current voltage at the side of the other end of relays RL1-RL4 is measured, respectively, and the good or bad of semiconductor device 101 is judged based on the measurement result.

Let relay RL1-relay RL4 be non-electrical connections in an AC test. And an alternating current signal is outputted from external output terminals TX+ and TX− of semiconductor device 101, the alternating current signal inputted into external input terminals RX+ and RX− of semiconductor device 101 via DUT board 102 is measured, and the good or bad of semiconductor device 101 is judged based on the measurement result.

[Modification 5 of a DUT Board]

Figure 30:
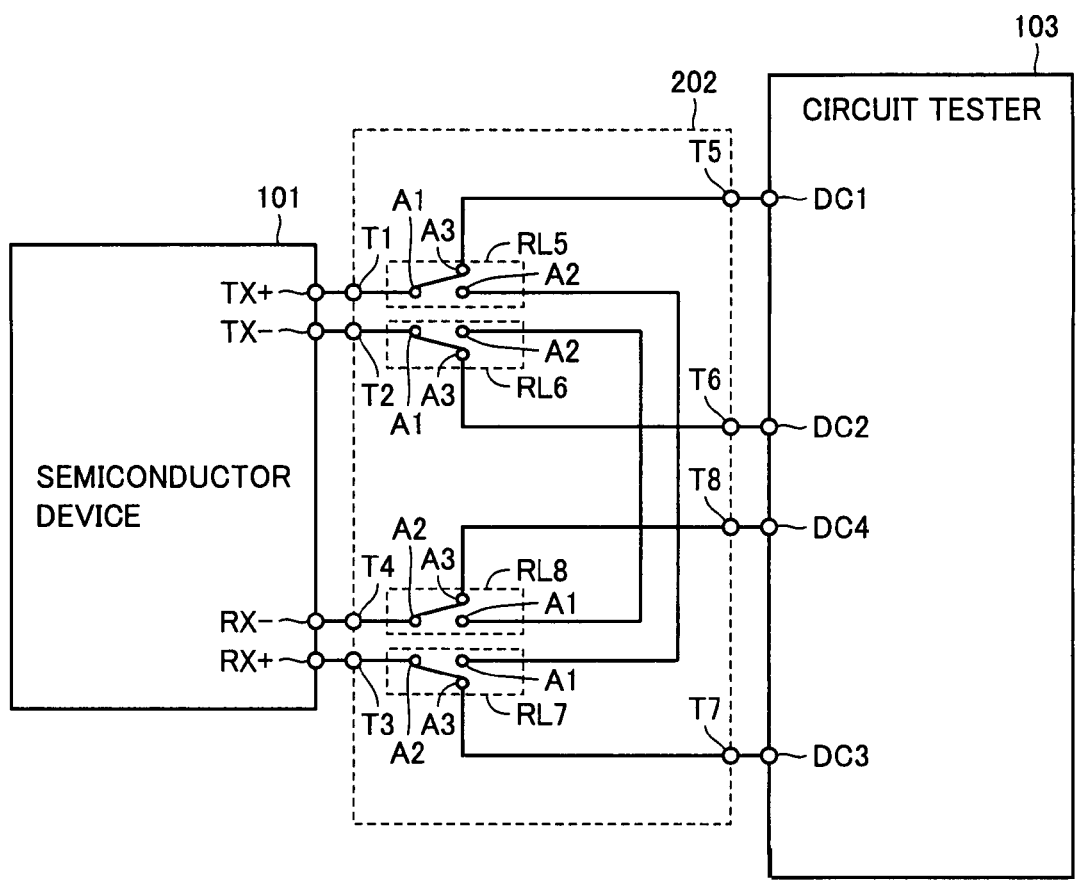

FIG. 30 is a drawing showing the structure of the modification of the DUT board concerning the first embodiment of the present invention.

DUT board 202 is provided with relays RL5-RL8, input terminals T1 and T2 for devices, output terminals T3 and T4 for devices, and output terminals T5-T8 for circuit testers with reference to FIG. 30.

Input terminals T1 and T2 for devices are connected to external output terminals TX+ and TX− of semiconductor device 101, respectively. Output terminals T3 and T4 for devices are connected to external input terminals RX+ and RX− of semiconductor device 101, respectively. Output terminals T5-T8 for circuit testers are connected to DC test terminals DC1-DC4 of circuit tester 103, respectively.

In relays RL5-RL8, each includes terminal A1-terminal A3. Input terminal T1 for devices is connected to terminal A1, terminal A1 of relay RL7 is connected to terminal A2, and, as for relay RL5, output terminal T5 for circuit testers is connected to terminal A3. Input terminal T2 for devices is connected to terminal A1, terminal A1 of relay RL8 is connected to terminal A2, and, as for relay RL6, output terminal T6 for circuit testers is connected to terminal A3. As for relay RL7, output terminal T3 for devices is connected to terminal A2, and output terminal T7 for circuit testers is connected to terminal A3. As for relay RL8, output terminal T4 for devices is connected to terminal A2, and output terminal T8 for circuit testers is connected to terminal A3.

In the manufacturing method of the semiconductor device using DUT board 202, the DC test and AC test of an interface circuitry for high-speed differential signals are performed in final test FT like the case where DUT board 102 is used.

In a DC test, the electrical connection of terminal A1 and terminal A3 of relay RL5-relay RL6 is performed, the voltage at the side of terminal A3 is measured, respectively, and the good or bad of semiconductor device 101 is judged based on the measurement result. The electrical connection of terminal A2 and terminal A3 of relay RL7-relay RL8 is performed, the voltage at the side of terminal A3 is measured, respectively, and the good or bad of semiconductor device 101 is judged based on the measurement result.

In an AC test, the each electrical connection of terminal A1 and terminal A2 of relay RL5-relay RL8 is performed. And an alternating current signal is outputted from external output terminals TX+ and TX− of semiconductor device 101, the alternating current signal inputted into external input terminal RX+ and RX− of semiconductor device 101 via DUT board 102 is measured, and the good or bad of semiconductor device 101 is judged based on the measurement result.

[The Modification of a DUT Board and a Circuit Tester]

Figure 31:
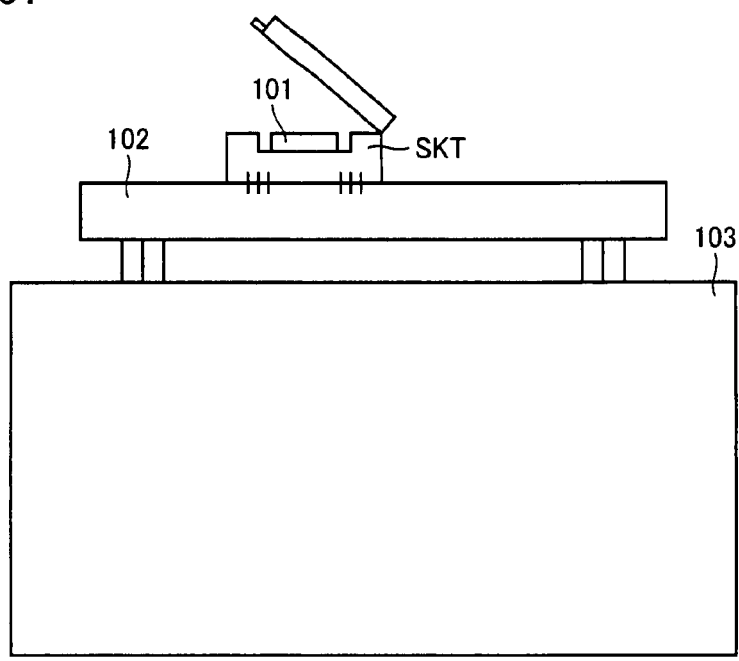
FIG. 31 is an outline view showing the structure of the modification of a DUT board and a circuit tester concerning the first embodiment of the present invention.

FIG. 31 is an outline view showing the structure of the modification of a DUT board and a circuit tester concerning the first embodiment of the present invention.

With reference to FIG. 31, DUT board 102 is provided with socket SKT in which semiconductor device 101 is mounted, and has the function to electrically connect semiconductor device 101 and circuit tester 103. Like DUT board 102 shown in FIG. 15, circuit tester 103 is provided with capacitors C1-C4 and coils L1-L4, and has a function which turns the alternating current signal outputted from semiconductor device 101, and outputs the turned signal to semiconductor device 101.

Thus, reduction of the manufacturing cost of a semiconductor device can be aimed at by simplifying the structure of DUT board 102 which needs to be prepared according to the kind of semiconductor device 101, and communizing circuit tester 103 with a various kind.

Next, other embodiments of the present invention are explained using a drawing. The same reference is given to the same or the corresponding portion in a drawing, and the explanation is not repeated.

Embodiment 2

This embodiment relates to the semiconductor device which changed the structure of the pad to the semiconductor device concerning the first embodiment. It is the same as that of the semiconductor device and a manufacturing method of a semiconductor device concerning the first embodiment except the contents explained below.

Figure 32:
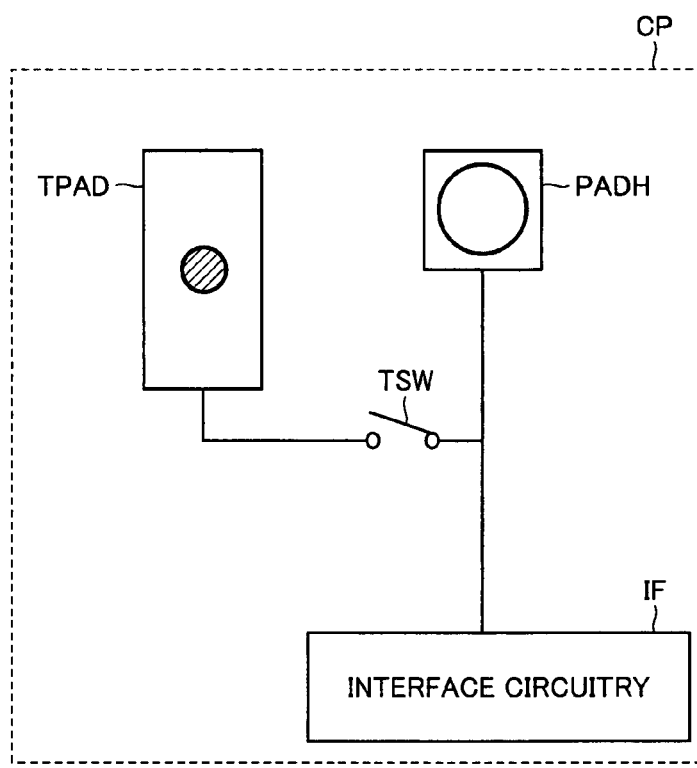
FIG. 32 is a drawing showing the pad structure of the semiconductor device concerning the second embodiment of the present invention.

FIG. 32 is a drawing showing the pad structure of the semiconductor device concerning the second embodiment of the present invention. Semiconductor integrated circuit CP is provided with pad TPAD for DC measuring, bonding pad PADH for high speed signals, semiconductor switch TSW for a test, and interface-circuitry IF with reference to FIG. 32. Interface-circuitry IF is equivalent to driver circuit 1 or receiver circuit 2.

In the manufacturing method of the semiconductor device concerning the second embodiment of the present invention, the DC test of a semiconductor device is performed by measuring the voltage in pad TPAD for DC measuring by making semiconductor switch TSW for a test into ON state.

When interface-circuitry IF is equivalent to driver circuit 1, semiconductor switch TSW for a test is made into OFF state in an AC test. And an alternating current signal is outputted to an external circuit via bonding pad PADH from interface-circuitry IF. And the alternating current signal which passed through the external circuit is received in receiver circuit 2 which is not illustrated. Based on the alternating current signal which receiver circuit 2 received, the good or bad of semiconductor device 101 is judged.

On the other hand, when interface-circuitry IF is equivalent to receiver circuit 2, in an AC test, semiconductor switch TSW for a test is made into OFF state, and an alternating current signal is outputted to an external circuit from driver circuit 1 which is not illustrated. And the alternating current signal which passed through the external circuit is received by interface-circuitry IF via bonding pad PADH. Based on the alternating current signal which interface-circuitry IF received, the good or bad of semiconductor device 101 is judged.

A high-speed differential signal is transmitted or received by interface-circuitry IF by making semiconductor switch TSW for a test into OFF state in normal operation.

Figure 33:
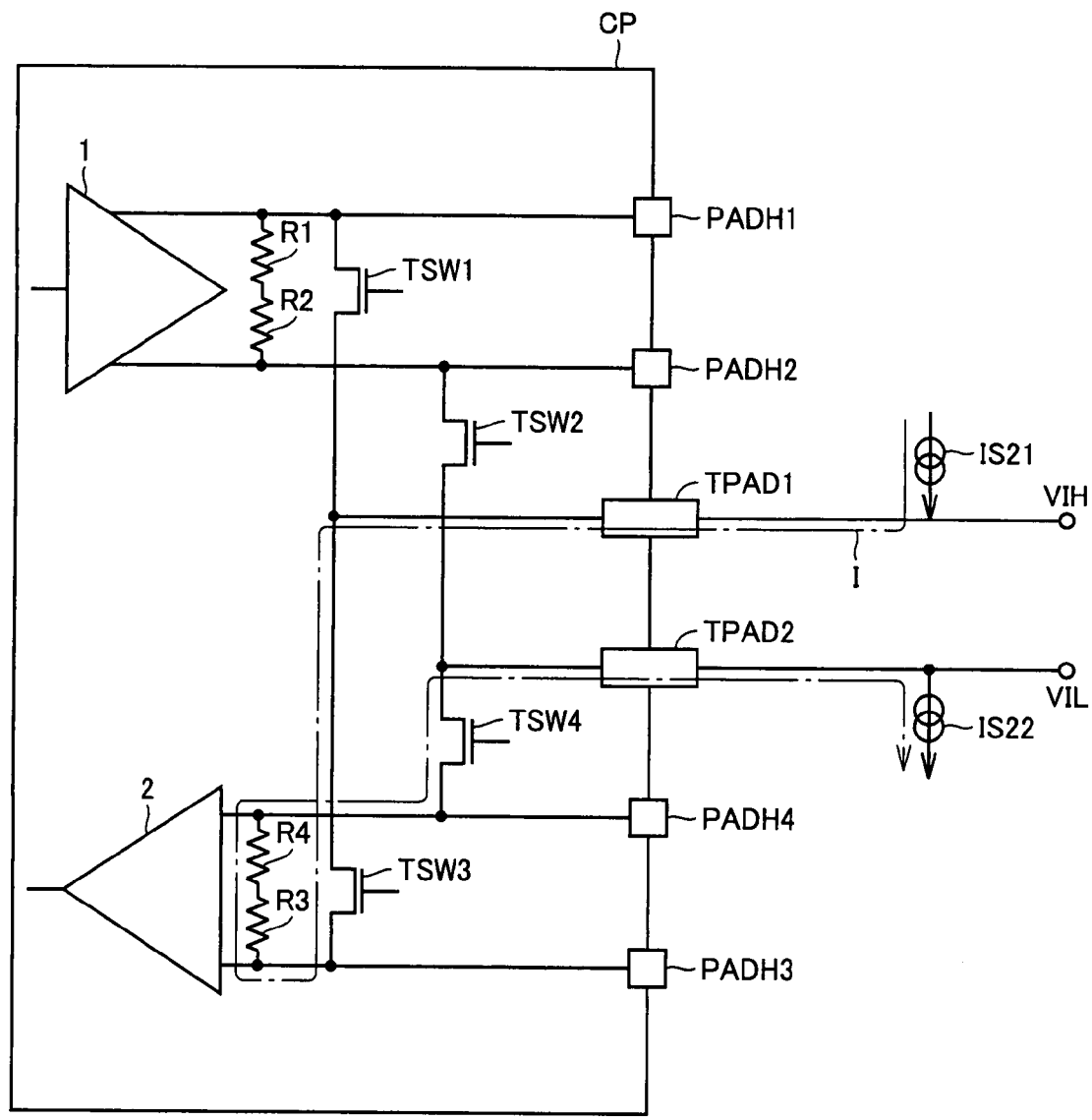
FIG. 33 is a drawing for explaining the DC test of the receiver circuit in the semiconductor device concerning the second embodiment of the present invention.

FIG. 33 is a drawing for explaining the DC test of the receiver circuit in the semiconductor device concerning the second embodiment of the present invention.

With reference to FIG. 33, semiconductor integrated circuit CP has driver circuit 1 and receiver circuit 2 for high-speed differential signals, pads TPAD1 and TPAD2 for DC measuring, bonding pads PADH1-PADH2 for high-speed differential signals (pad for output signals), bonding pads PADH3-PADH4 for high-speed differential signals (pad for input signals), semiconductor switches TSW1-TSW2 for a test (first switching element), semiconductor switches TSW3-TSW4 for a test (second switching element), and resistance R1-R4.

As for semiconductor switch TSW1 for a test, one end is connected to one side of the differential output of driver circuit 1, bonding pad PADH1, and one end of resistance R1. As for semiconductor switch TSW2 for a test, one end is connected to the other of the differential output of driver circuit 1, bonding pad PADH2, and one end of resistance R2. As for semiconductor switch TSW3 for a test, one end is connected to one side of the difference input of receiver circuit 2, bonding pad PADH3, and one end of resistance R3. As for semiconductor switch TSW4 for a test, one end is connected to the other of the difference input of receiver circuit 2, bonding pad PADH4, and one end of resistance R4.

Pad TPAD 1 for DC measuring is connected to the other end of semiconductor switch TSW1 for a test, and the other end of semiconductor switch TSW3 for a test. Pad TPAD2 for DC measuring is connected to the other end of semiconductor switch TSW2 for a test, and the other end of semiconductor switch TSW4 for a test. The other end of resistance R1 and the other end of resistance R2 are connected. The other end of resistance R3 and the other end of resistance R4 are connected.

In the manufacturing method of the semiconductor device concerning the second embodiment of the present invention, the DC test of the interface circuitry for high-speed differential signals is performed in wafer test WT.

In the DC test of receiver circuit 2, semiconductor switches TSW1 and TSW2 for a test are made into OFF state, and semiconductor switches TSW3 and TSW4 for a test are made into ON state. Current source IS21 is electrically connected to pad TPAD1 for DC measuring, and current source IS22 is electrically connected to pad TPAD2 for DC measuring. And between current source IS21 and current source IS22, direct current I is sent and voltage VOH in pad TPAD1 for DC measuring and voltage VOL in pad TPAD2 for DC measuring are measured.

And when the voltage value of at least either one of voltage VOH and voltage VOL is outside a prescribed range, trouble is in resistance R3 and resistance R4 etc., and it judges with a semiconductor device being a defective unit.

Figure 34:
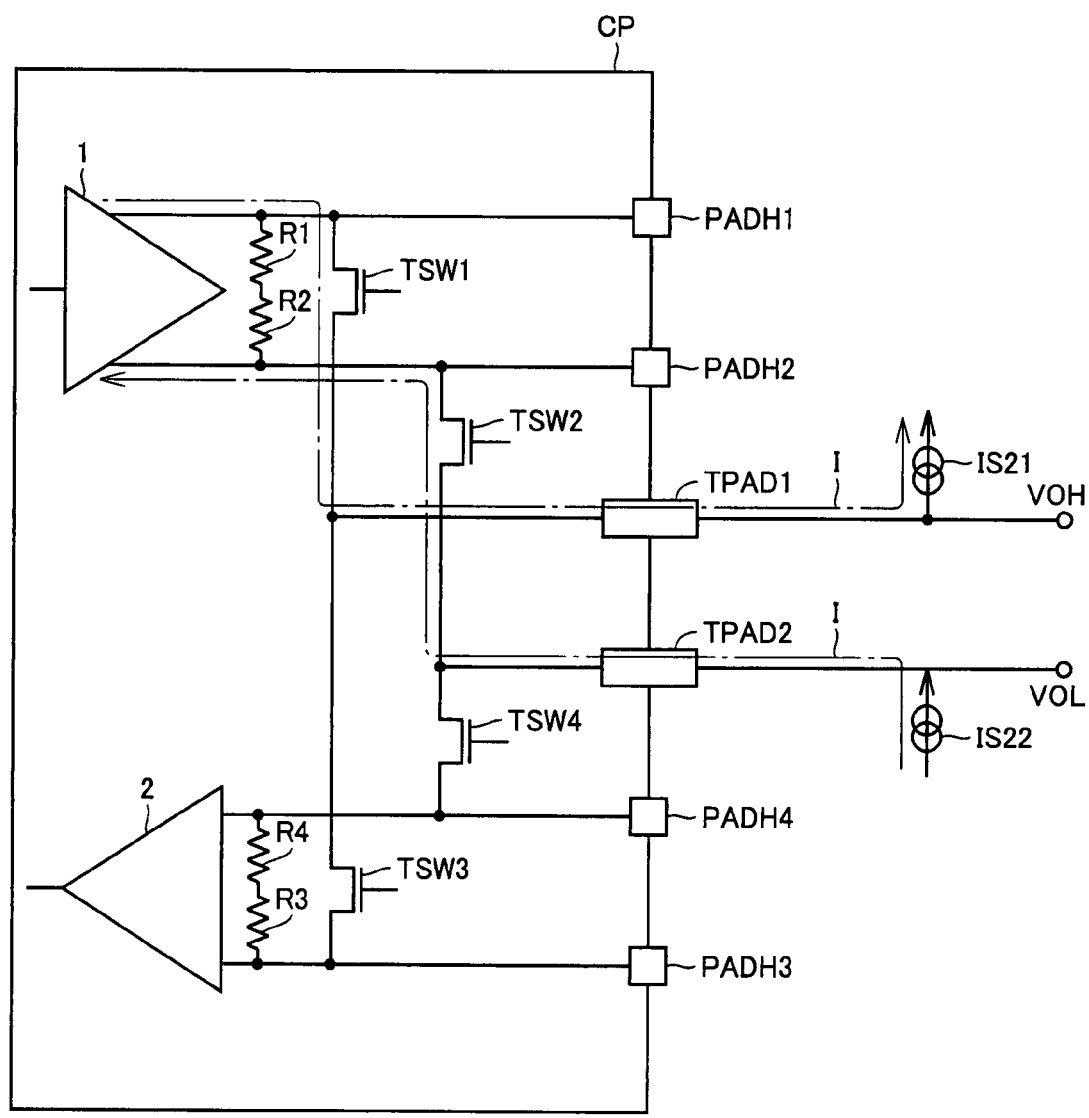
FIG. 34 is a drawing for explaining the DC test of the driver circuit in the semiconductor device concerning the second embodiment of the present invention.

FIG. 34 is a drawing for explaining the DC test of the driver circuit in the semiconductor device concerning the second embodiment of the present invention.

In the DC test of driver circuit 1, semiconductor switches TSW1 and TSW2 for a test are made into ON state, and semiconductor switches TSW3 and TSW4 for a test are made into OFF state. And direct current I is sent through current source IS21 via pad TPAD1 for DC measuring from driver circuit 1, and voltage VOH in pad TPAD1 for DC measuring is measured. Direct current I is sent through driver circuit 2 via pad TPAD2 for DC measuring from current source IS22, and voltage VOL in pad TPAD2 for DC measuring is measured. When voltage VOH or voltage VOL is less than a predetermined value, it judges with semiconductor device 101 being a defective unit.

By such structure, in a wafer state, the defect of the DC characteristic of a semiconductor integrated circuit can be detected, it can prevent manufacture of a semiconductor package becoming useless, and reduction of a manufacturing cost can be aimed at.

Figure 35:
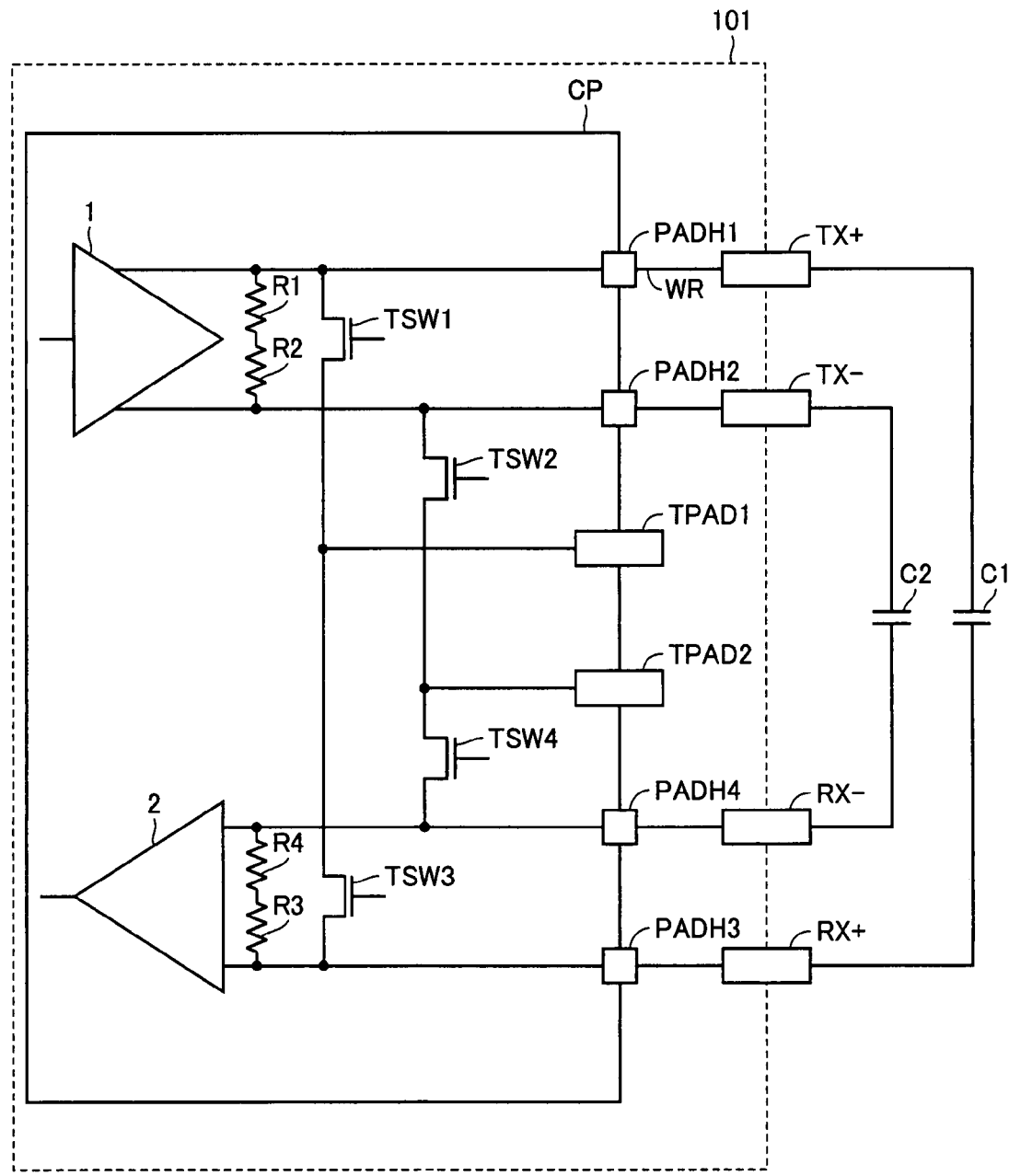
FIG. 35 is a drawing for explaining the AC test of the semiconductor device concerning the second embodiment of the present invention.

FIG. 35 is a drawing for explaining the AC test of the semiconductor device concerning the second embodiment of the present invention.

In the manufacturing method of the semiconductor device related to the second embodiment of the present invention with reference to FIG. 35, the AC test of the interface circuitry for high-speed differential signals is performed in final test FT.

In an AC test, semiconductor switches TSW1-TSW4 for a test are made into OFF state. External output terminal TX+ connected with bonding pad PADH1 and external input terminal RX+ connected with bonding pad PADH3 are electrically connected via capacitor C1. External output terminal TX− connected with bonding pad PADH2 and external input terminal RX− connected with bonding pad PADH4 are electrically connected via capacitor C2.

And an alternating current signal is outputted from the differential output of driver circuit 1, respectively. The alternating current signal which receiver circuit 2 received via external output terminal TX+, capacitor C1, and external input terminal RX+, and the alternating current signal which receiver circuit 2 received via external output terminal TX−, capacitor C2, and external input terminal RX− are measured. Based on the measurement result, the good or bad of semiconductor device 101 is judged.

By the way, in order to fully secure the region to which a probe is applied, and the region which pastes up a bonding wire as mentioned above, when area of a bonding pad is enlarged, the parasitic capacitance to a bonding pad became large, and there was a problem that the AC characteristics of a semiconductor device will deteriorate.

However, semiconductor integrated circuit CP is provided with pad TPAD for DC measuring, bonding pad PADH, and semiconductor switch TSW for a test in the manufacturing method of the semiconductor device concerning the second embodiment of the present invention. And in a DC test, the voltage in pad TPAD for DC measuring is measured by making semiconductor switch TSW for a test into ON state. An alternating current signal is outputted and inputted via bonding pad PADH by making semiconductor switch TSW for a test into OFF state in an AC test and normal operation. The bonding pad for DC measuring and the transmission line of an alternating current signal are electrically separable with such structure in an AC test and normal operation. Therefore, parasitic capacitance to the bonding pad for signals can be made small, and degradation of AC characteristics can be prevented.

Although the manufacturing method of the semiconductor device concerning the second embodiment of the present invention has the structure of performing a DC test in wafer test WT, and performing an AC test in final test FT, it does not limit to this. It is also possible to do a DC test in final test FT. It is also possible to do an AC test in wafer test WT.

[The Modification of a Semiconductor Device]

Figure 36:
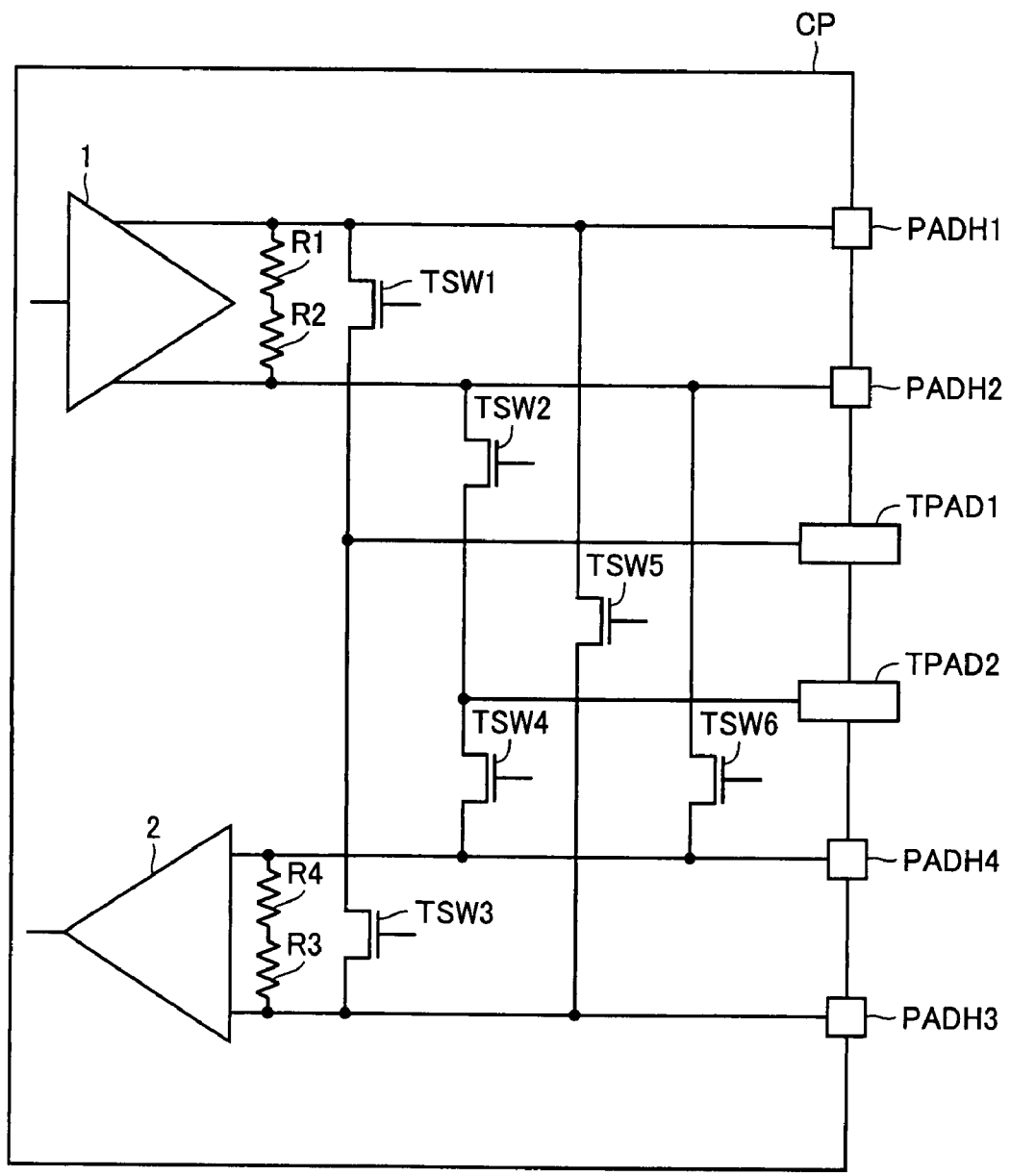
FIG. 36 is a drawing showing the structure of the semiconductor device concerning the modification of the second embodiment of the present invention.

FIG. 36 is a drawing showing the structure of the semiconductor device concerning the modification of the second embodiment of the present invention.

With reference to FIG. 36, semiconductor device 101 is further provided with semiconductor switches TSW5-TSW6 for a test (third switching element) to the semiconductor device concerning the second embodiment of the present invention.

As for semiconductor switch TSW5 for a test, one end is connected to one side of the differential output of driver circuit 1, bonding pad PADH1, one end of resistance R1, and one end of semiconductor switch TSW1 for a test. The other end is connected to one side of the difference input of receiver circuit 2, bonding pad PADH3, one end of resistance R3, and one end of semiconductor switch TSW3 for a test.

As for semiconductor switch TSW6 for a test, one end is connected to the other of the difference input of driver circuit 1, bonding pad PADH2, one end of resistance R2, and one end of semiconductor switch TSW2 for a test. The other end is connected to the other of the difference input of receiver circuit 2, bonding pad PADH4, one end of resistance R4, and one end of semiconductor switch TSW4 for a test.

In the manufacturing method of the semiconductor device concerning the modification of the second embodiment of the present invention, the DC test and AC test of an interface circuitry for high-speed differential signals are performed in wafer test WT.

In the DC test of receiver circuit 2, semiconductor switches TSW1, TSW2, TSW5, and TSW6 for a test are made into OFF state, and semiconductor switches TSW3 and TSW4 for a test are made into ON state. Since others are the same as that of the DC test of the semiconductor device concerning the second embodiment of the present invention shown in FIG. 33, detailed explanation is not repeated here.

In the DC test of driver circuit 1, semiconductor switches TSW1 and TSW2 for a test are made into ON state, and semiconductor switches TSW3-TSW6 for a test are made into OFF state. Since others are the same as that of the DC test of the semiconductor device concerning the first embodiment of the present invention shown in FIG. 16, detailed explanation is not repeated here.

In an AC test, semiconductor switches TSW1-TSW4 for a test are made into OFF state, and semiconductor switches TSW5-TSW6 for a test are made into ON state.

And an alternating current signal is outputted from the differential output of driver circuit 1, respectively, the alternating current signal which receiver circuit 2 received via semiconductor switches TSW5-TSW6 for a test is measured, and the good or bad of semiconductor device 101 is judged based on the measurement result.

By such structure, the defect of the AC characteristics of a semiconductor integrated circuit can also be detected in a wafer state. Reduction of a manufacturing cost can be further aimed at to the manufacturing method of the semiconductor device concerning the second embodiment of the present invention.

With all the points, the embodiment disclosed this time is exemplification and should be considered not to be restrictive. The range of the present invention is shown by not the abovementioned explanation but the claim, and it is meant that all the change in a meaning and the range equivalent to a claim is included.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device having a semiconductor integrated circuit, comprising the steps of:
   forming the semiconductor integrated circuit having
   a driver circuit which transmits a signal to an outside;
   a receiver circuit which receives a signal from an outside;
   a pad for output signals coupled to the driver circuit;
   a pad for input signals coupled to the receiver circuit;
   a pad for measurement;
   a first switching element having one end coupled at a junction point of the driver circuit and the pad for output signals, and the other end coupled to the pad for measurement; and
   a second switching element having one end coupled at a junction point of the receiver circuit and the pad for input signals, and the other end is coupled to the pad for measurement;
   performing a direct current test which judges good or bad of the semiconductor device based on a voltage in the pad for measurement by making the first switching element into ON state, and making the second switching element into OFF state, or by making the first switching element OFF state, and making the second switching element into ON state; and
   performing an alternating current test which outputs an alternating current signal to an external circuit via the pad for output signals from the driver circuit by making the first switching element and the second switching element into OFF state, receives the alternating current signal which passed through the external circuit in the receiver circuit via the pad for input signals, and judges good or bad of the semiconductor device based on the alternating current signal which the receiver circuit received.

2. The manufacturing method of a semiconductor device according to claim 1, further comprising the steps of:
   preparing an external output terminal and an external input terminal; and
   performing bonding of the pad for output signals, and the external output terminal, and performing bonding of the pad for input signals, and the external input terminal after judging good or bad of the semiconductor device in the step of performing a direct current test;
   wherein in the step of performing an alternating current test, an alternating current signal is outputted to an external circuit via the pad for output signals and the external output terminal from the driver circuit by making the first switching element and the second switching element into OFF state, the alternating current signal which passed through the external circuit is received in the receiver circuit via the external input terminal and the pad for input signals, and based on the alternating current signal which the receiver circuit received, good or bad of the semiconductor device is judged.

3. The manufacturing method of a semiconductor device according to claim 1, wherein
   in the step of forming the semiconductor integrated circuit, the semiconductor integrated circuit including a driver circuit which transmits a signal whose maximum frequency is 500 MHz or more to an outside, a receiver circuit which receives a signal whose maximum frequency is 500 MHz or more from an outside, the pad for output signals, the pad for input signals, the pad for measurement, the first switching element, and the second switching element, is formed.

4. The manufacturing method of a semiconductor device according to claim 1, wherein
   in the step of forming the semiconductor integrated circuit, the semiconductor integrated circuit which includes a driver circuit which transmits a differential signal to an outside, and a receiver circuit which receives a differential signal from an outside, and which further includes two pieces of the pads for output signals, the pads for input signals, the pads for measurement, the first switching elements, and the second switching elements corresponding to a differential signal, is formed.

5. A manufacturing method of a semiconductor device having a semiconductor integrated circuit, comprising the steps of:
   forming the semiconductor integrated circuit having
   a driver circuit which transmits a signal to an outside;
   a receiver circuit which receives a signal from an outside;
   a pad for output signals coupled to the driver circuit;
   a pad for input signals coupled to the receiver circuit;
   a pad for measurement;
   a first switching element having one end coupled at a junction point of the driver circuit and the pad for output signals, and the other end coupled to the pad for measurement;
   a second switching element having one end coupled at a junction point of the receiver circuit and the pad for input signals, and the other end coupled to the pad for measurement; and
   a third switching element having one end coupled to the driver circuit, and the other end coupled to the receiver circuit;
   performing a direct current test which judges good or bad of the semiconductor device based on a voltage in the pad for measurement by making the first switching element into ON state, and making the second switching element and the third switching element into OFF state, or by making the first switching element and the third switching element into OFF state, and making the second switching element into ON state; and performing an alternating current test which outputs an alternating current signal to the receiver circuit via the third switching element from the driver circuit by making the first switching element and the second switching element into OFF state, and making the third switching element into ON state, and judges good or bad of the semiconductor device based on the alternating current signal which the receiver circuit received.

6. A semiconductor device having a semiconductor integrated circuit, wherein the semiconductor integrated circuit comprises:

a driver circuit which transmits a signal to an outside;

a receiver circuit which receives a signal from an outside;

a pad for output signals coupled to the driver circuit;

a pad for input signals coupled to the receiver circuit;

a pad for measurement;

a first switching element having one end coupled at a junction point of the driver circuit and the pad for output signals, and the other end coupled to the pad for measurement; and a second switching element having one end coupled at a junction point of the receiver circuit and the pad for input signals, and the other end coupled to the pad for measurement.

7. The semiconductor device according to claim 6, wherein the semiconductor integrated circuit includes further a third switching element having one end coupled to the driver circuit, and the other end coupled to the receiver circuit.

8. The semiconductor device according to claim 6, wherein a maximum frequency of an output signal of the driver circuit and an input signal of the receiver circuit is 500 MHz or more.

9. The semiconductor device according to claim 6, wherein an output signal of the driver circuit and an input signal of the receiver circuit are differential signals; and the semiconductor integrated circuit includes two pieces of the pads for output signals, the pads for input signals, the pads for measurement, the first switching elements, and the second switching elements corresponding to the differential signal.

\* \* \* \* \*